US012776263B2

(12) United States Patent
Li et al.

(10) Patent No.: US 12,776,263 B2
(45) Date of Patent: Oct. 27, 2026

(54) DISPLAY PANEL AND DISPLAY DEVICE

(71) Applicant: WUHAN TIANMA MICROELECTRONICS CO., LTD., Wuhan (CN)

(72) Inventors: Lida Li, Wuhan (CN); Yangzhao Ma, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 1144 days.

(21) Appl. No.: 17/412,229

(22) Filed: Aug. 25, 2021

(65) Prior Publication Data

US 2021/0384289 A1 Dec. 9, 2021

(30) Foreign Application Priority Data

Jun. 30, 2021 (CN) ......................... 202110736678.6

(51) Int. Cl.
*G09G 3/3233* (2016.01)
*G09G 3/32* (2016.01)
*H10K 59/131* (2023.01)

(52) U.S. Cl.
CPC ............. *G09G 3/3233* (2013.01); *G09G 3/32* (2013.01); *G09G 2300/0426* (2013.01);
(Continued)

(58) Field of Classification Search
None
See application file for complete search history.

(56) References Cited

U.S. PATENT DOCUMENTS

2022/0005405 A1* 1/2022 Aoki ........................ G09G 3/32
2023/0368727 A1* 11/2023 Yu ............................ G09G 3/32
(Continued)

FOREIGN PATENT DOCUMENTS

CN 110707139 A 1/2020
CN 111584610 A 8/2020
(Continued)

OTHER PUBLICATIONS

State Intellectual Property Office of the People's Republic of China, Text of First Office Action mailed Apr. 28, 2022, issued in Chinese Application No. 202110736678.6, filed Jun. 30, 2021, 9 pages.
(Continued)

*Primary Examiner* — Andre L Matthews
(74) *Attorney, Agent, or Firm* — CHRISTENSEN O'CONNOR JOHNSON KINDNESS PLLC

(57) ABSTRACT

Provided are a display panel and a display device. The display penal includes pixel circuits, light-emitting devices, first reset signal lines, second reset signal lines, and auxiliary signal lines. Each pixel circuit includes a driving transistor, a first reset transistor, and a second reset transistor. The first reset transistor includes a first electrode electrically connected to one of the first reset signal lines, and a second electrode electrically connected to a control terminal of the second reset transistor. The second reset transistor includes a first electrode electrically connected to one of the second reset signal lines, and a second electrode electrically connected to a first electrode of one of the light-emitting devices. The auxiliary signal line intersects with and is electrically connected to the first reset signal line or the second reset signal line.

11 Claims, 27 Drawing Sheets

(52) U.S. Cl.
CPC ............... *G09G 2300/0819* (2013.01); *G09G 2300/0842* (2013.01); *G09G 2320/0233* (2013.01); *G09G 2320/0252* (2013.01); *H10K 59/131* (2023.02)

(56) References Cited

U.S. PATENT DOCUMENTS

| | | | | |
|---|---|---|---|---|
| 2024/0099084 | A1* | 3/2024 | Liu | H10K 59/12 |
| 2024/0164156 | A1* | 5/2024 | Cai | G09G 3/3225 |
| 2024/0213261 | A1* | 6/2024 | Wei | G09G 3/3233 |
| 2024/0224637 | A1* | 7/2024 | Wang | G09G 3/3233 |

FOREIGN PATENT DOCUMENTS

| | | | |
|---|---|---|---|
| CN | 211265478 | U | 8/2020 |
| CN | 111968581 | A | 11/2020 |
| CN | 112103316 | A | 12/2020 |
| CN | 114335074 | A | 4/2022 |

OTHER PUBLICATIONS

First Chinese Examination Opinion Notification mailed on Feb. 28, 2025, issued in Chinese App. No. 202211130575.6; 18 pages.

* cited by examiner

DISPLAY PANEL AND DISPLAY DEVICE

CROSS-REFERENCE TO RELATED APPLICATIONS

The present disclosure claims priority to Chinese Patent Application No. 202110736678.6, filed on Jun. 30, 2021, the content of which is incorporated herein by reference in its entirety.

TECHNICAL FIELD

The present disclosure relates to the technical field of display, and in particular, to a display panel and a display device.

BACKGROUND

Liquid crystal displays and the organic light-emitting displays are two mainstream display technologies. The organic self-illuminating display can be made light and thin due to their self-illuminating characteristics. Such organic self-illuminating displays also have low power consumption, high contrast, and high response speed, etc. Organic light-emitting diodes are current-driven devices, and, thus, a pixel circuit corresponding thereto is provided in the display panel. A plurality of transistors is provided in the pixel circuit to cooperate with each other to drive the organic light-emitting diodes. In order to meet the requirements for the display panel under different application scenarios, the display panel usually has a high frequency operation mode and a low frequency operation mode. For example, an image such as an animation which requires a higher refresh rate is displayed in the high frequency operation mode, and a static image is displayed in the low frequency operation mode. However, display uniformity occurs in the high frequency operation mode of the display panel.

SUMMARY

In a first aspect, an embodiment of the present disclosure provides a display panel. The display panel includes pixel circuits, light-emitting devices, first reset signal lines, second reset signal lines, and auxiliary signal lines. Each of the pixel circuits includes a driving transistor, a first reset transistor, and a second reset transistor. The first reset transistor includes a first electrode electrically connected to one of the first reset signal lines, and a second electrode electrically connected to a control terminal of the second reset transistor. The second reset transistor includes a first electrode electrically connected to one of the second reset signal lines, and a second electrode electrically connected to a first electrode of one of the light-emitting devices. One of the auxiliary signal lines intersects with and is electrically connected to one of the first reset signal lines or one of the second reset signal lines.

In a second aspect, an embodiment of the present disclosure provides a display device including the display panel described above.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, and other drawings can also be acquired by those skilled in the art.

DESCRIPTION OF EMBODIMENTS

In order to make the purpose, technical solutions, and advantages of the embodiments of the present disclosure be understandable, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

An embodiment of the present disclosure provides a display panel, and the display panel includes a plurality of light-emitting devices and a plurality of pixel circuits for driving the plurality of light-emitting devices to emit light. In an embodiment, the light-emitting device is an organic light-emitting device. In another embodiment, the light-emitting device is an inorganic light-emitting device. The light-emitting device includes a first electrode, a light-emitting layer, and a second electrode that are sequentially stacked; and one of the first electrode and the second electrode is an anode, and the other one of the first electrode and the second electrode is a cathode.

Figure 1:
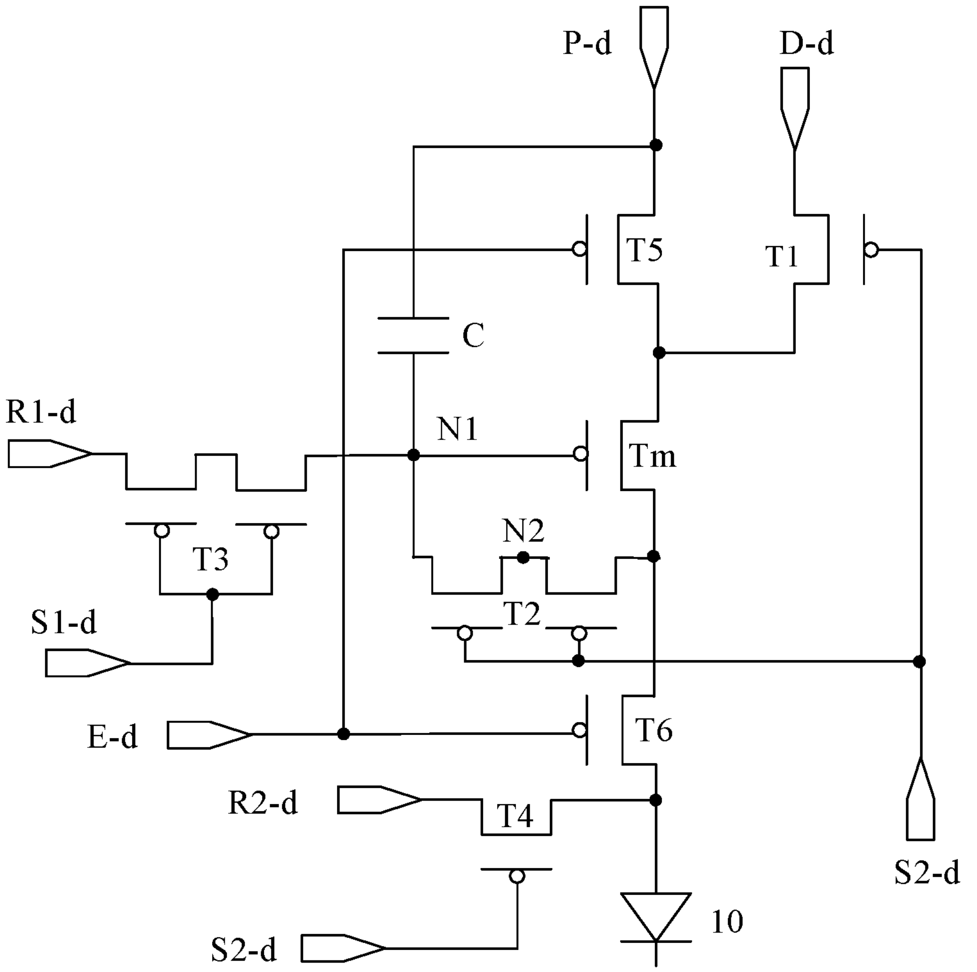
FIG. 1 is a schematic diagram of a pixel circuit in a display panel according to an embodiment of the present disclosure.
Figure 2:
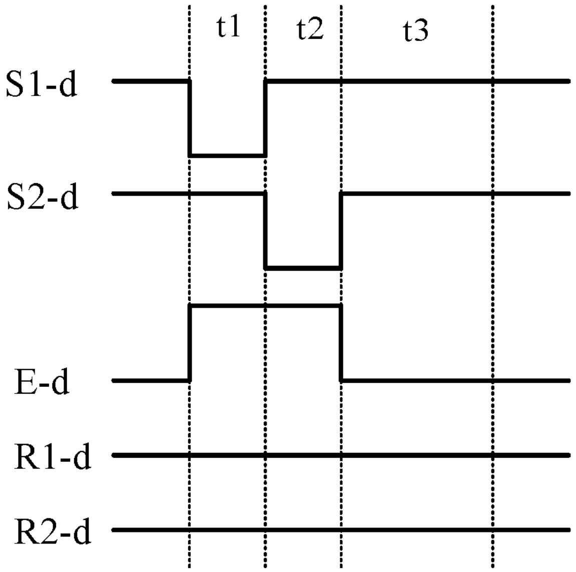
FIG. 2 is a timing sequence diagram of the pixel circuit shown in FIG. 1 according to an embodiment of the present disclosure.

FIG. 1 is a schematic diagram of a pixel circuit in a display panel according to an embodiment of the present disclosure, and FIG. 2 is a timing sequence diagram of the pixel circuit shown in FIG. 1. As shown in FIG. 1, the pixel circuit includes seven transistors and one storage capacitance C, i.e., a 7T1C pixel circuit. The seven transistors include a driving transistor Tm, a data writing transistor T1, a threshold compensation transistor T2, a first reset transistor T3, a second reset transistor T4, a first light-emitting control transistor T5, and a second light-emitting control transistor T6. The first reset transistor T3 is configured to reset a control terminal of the driving transistor Tm, and the second reset transistor T4 is configured to reset a first electrode of the light-emitting device 10.

As shown in FIG. 1, a first electrode of the data writing transistor T1 is connected to a data signal terminal D-d, and a second electrode of the data writing transistor T1 is electrically connected to a first electrode of the driving transistor Tm; a first electrode of the threshold compensation transistor T2 is electrically connected to a second electrode of the driving transistor Tm, and a second electrode of the threshold compensation transistor T2 is electrically connected to the control terminal of the driving transistor Tm, here, a first node N1 is shown in FIG. 1, and both the control terminal of the driving transistor Tm and the second electrode of the threshold compensation transistor T2 are connected to the first node N1; a first electrode of the first light-emitting control transistor T5 is connected to a power signal terminal p-d, and a second electrode of the first light-emitting control transistor T5 is electrically connected to the first electrode of the driving transistor Tm; a first electrode of the second light-emitting control transistor T6 is electrically connected to the second electrode of the driving transistor Tm, and a second electrode of the second light-emitting control transistor T6 is electrically connected to the first electrode of light-emitting device 10; a first electrode of the first reset transistor T3 is electrically connected to a first reset terminal R1-*d*, and a second electrode of the first reset transistor T3 is electrically connected to the control terminal of the driving transistor Tm; a first electrode of the second reset transistor T4 is electrically connected to a second reset terminal R2-*d*, and a second electrode of the second reset transistor T4 is electrically connected to the first electrode of the light-emitting device 10. A control terminal of the first reset transistor T3 is connected to a first scan terminal S1-*d*; a control terminal of the data writing transistor T1, a control terminal of the threshold compensation transistor T2, and a control terminal of the second reset transistor T4 are connected to a second scan terminal S2-*d*; and a control terminal of the first light-emitting control transistor T5 and a control terminal of the second light-emitting control transistor T6 are connected to a light-emitting control terminal E-d. It should be noted that the expression "A being electrically connected to B" recorded in the present disclosure refers to an electrical connection, which indicates that different components in a circuit are connected to each other through a physical wire or a transistor that can transmit an electrical signal.

The display panel includes a power line, a data line, a scan line, a first reset signal line, a second reset signal line, and a light-emitting control line. The power signal terminal P-d is connected to the power line, the data signal terminal D-d is connected to the data line, the first reset terminal R1-*d* is connected to the first reset signal line, the second reset terminal R2-*d* is connected to the second reset signal line, and the light-emitting control terminal E-D is connected to the light-emitting control line.

The scan terminal (the first scan terminal S1-*d* and the second scan terminal S2-*d*) is connected to the scan line. The display panel further includes a scanning driving circuit including cascaded shift registers, and the scan terminal is connected to the scanning driving circuit through the scan line. In an embodiment, for one pixel circuit, the first scan terminal S1-*d* is connected to an $n^{th}$ shift register through one scan line, and the second scan terminal S2-*d* is connected to a $(n+1)^{th}$ shift register through one scan line. In an embodiment, as shown in FIG. 1, the data writing transformer T1 and the second reset transformer T4 are connected to a same scan terminal. In another embodiment, the data writing transformer T1 and the second reset transformer T4 are connected to different scan terminals, which is not shown in the figures.

A working process of the pixel circuit includes a reset phase t1, a data writing phase t2, and a light-emitting phase t3, which will be illustrated in combination with the timing sequence diagram shown in FIG. 2.

During the reset phase t1, the first scan terminal S1-*d* provides an enable signal to control the first reset transformer T3 to be turned on; and after the first reset transmitter T3 is turned on, a first reset signal provided by the first reset terminal R1-*d* is written to the control terminal of the driving transmitter Tm to reset the control terminal of the driving transmitter Tm.

During the data writing phase t2, the second scan terminal S2-*d* provides an enable signal to control the data writing transformer T1 and the threshold compensation transformer T2 to be turned on, a data voltage provided by the data signal terminal D-d is written to the control terminal of the driving transformer Tm, and a threshold voltage of the driving transformer Tm is compensated. Meanwhile, the second scan terminal S2-*d* controls the second reset transmitter T4 to be turned on, and a second reset signal provided by the second reset terminal R2-*d* is written to the first electrode of the light-emitting device 10 to reset the first electrode of the light-emitting device 10.

During the light-emitting phase t3, the light-emitting control terminal E-d provides an enable signal to control the first light-emitting control transistor T5 and the second light-emitting control transistor T6 to be turned on, and during this phase, the driving transistor Tm provides a driving current to the light-emitting device 10 to control the light-emitting device 10 to emit light.

A voltage of the first reset signal provided by the first reset terminal R1-*d* is higher than a voltage of the second reset signal provided by the second reset terminal R2-*d*. In this embodiment, resetting the control terminal of the driving transmitter Tm is performed in a different phase from resetting the first electrode of the light-emitting device 10. In other embodiments, resetting the control terminal of the driving transmitter Tm is performed in a same phase as resetting the first electrode of the light-emitting device 10.

When resetting the control terminal of the driving transformer Tm, a higher reset voltage signal is provided to the control terminal of the driving transformer Tm through the first reset terminal R1-*d*. Then after the data writing phase, the closer the voltage of the control terminal of the driving transformer Tm is to Vdata−|vth| (Vdata is the data voltage, and Vth is the threshold voltage of the driving transformer), the faster a threshold of the control terminal of the driving transmitter Tm is captured. That is, a response time for data writing and threshold capturing can be reduced. When applying to high-frequency display, the time for capturing the threshold of the control terminal of the driving transistor Tm is short. By reducing the response time and improving the response speed, the threshold can be captured more accurately and faster, thereby improving the display effect of high-frequency display, and thus meeting the display requirements of high-frequency application scenarios such as cellphone competitive games. Meanwhile, when resetting the first electrode of the light-emitting device 10, a lower reset voltage signal is provided to the first electrode of the light-emitting device through the second reset signal line R2, thereby reducing undesired light emitted by the light-emitting device, and thus improving the display effect at a low grayscale.

It should be noted that the pixel circuit in the above-mentioned embodiment of FIG. 1 is merely exemplarily illustrated. In another embodiment, the control terminal of the first reset transistor T3 and the control terminal of the second reset transistor T4 are connected to a same scan terminal. Then during the reset phase, the first reset transistor T3 and the second reset transistor T4 are turned on simultaneously, that is, resetting the control terminal of the driving transistor Tm is performed in a same phase as resetting the first electrode of the light-emitting device 10.

The display panel provided by an embodiment of the present disclosure can further include auxiliary signal lines, which are connected in parallel to the reset signal line to reduce the voltage drop on the reset signal line, thereby improving the brightness uniformity of a display area, further improving the display effect, and further reducing power consumption of the display panel to a certain extent.

Figure 3:
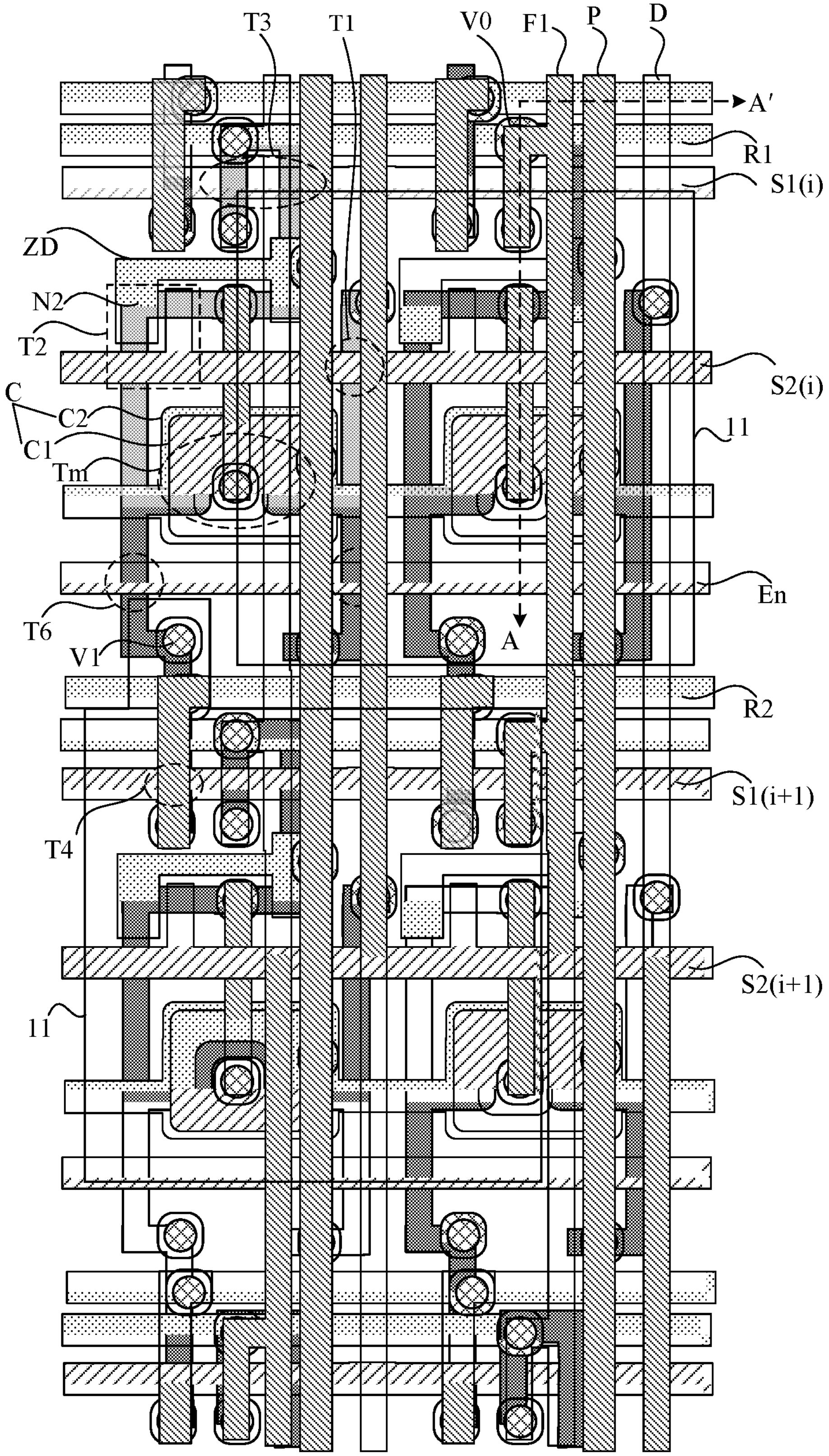
FIG. 3 is a schematic diagram of a display panel according to an embodiment of the present disclosure.

In an embodiment, the auxiliary signal lines include a first auxiliary signal line, which intersects with and is electrically connected to the first reset signal line. FIG. 3 is a diagram of a display panel according to an embodiment of the present disclosure, and the pixel circuit of FIG. 3 can be understood by reference to FIG. 1. FIG. 3 further shows a data line D, a power line P, a first scan line S1, a second scan line S2, a first reset signal line R1, a second reset signal line R2, and a light-emitting control line E of the display panel. In the display panel, taking the pixel circuit in an $i^{th}$ (i is a positive integer) row and the pixel circuit in a $(i+1)^{th}$ row as an example, then in this case, for the pixel circuit in the $i^{th}$ row, the control terminal of the first reset transistor T3 is connected to the first scan line S1(*i*), and the control terminal of the data writing transistor T1 is connected to the second scan line S2(*i*). It can be understood that, for the pixel circuit in the $(i+1)^{th}$ row, the control terminal of the first reset transistor T3 is connected to the first scan line S1(*i*+1), and the control terminal of the data writing transistor T1 is connected to the second scan line S2(*i*+1). A scan signal is provided to the scan line through the shift register. The first scan line S1(*i*) and the second scan line S2(*i*) are connected to output terminals of adjacent two shift registers, respectively, and the second scan line S2(*i*) corresponding to the pixel circuit in the $i^{th}$ row and the first scan line S1(*i*+1) corresponding to the pixel circuit in the $(i+1)^{th}$ row are connected to a same shift register (i.e., transmitting a same scan signal). Then, FIG. 3 shows that the second reset transistor T4 of the pixel circuit in the $i^{th}$ row is connected to the first scan line S1(*i*+1), and when the pixel circuit in the $i^{th}$ row is in operation, a process where the data writing transistor T1 is turned on to write the data signal and a process where the second reset transistor T4 is turned on to reset the first electrode of the light-emitting device are performed simultaneously.

It should be noted that in the following relevant embodiments, the connection between the first scan line S1 and the second scan line S2 and the transistors of the pixel circuits can be refereed to FIG. 3, and expressions such as S1(*i*) and S2(*i*) will no longer be indicated in the following embodiments.

As shown in FIG. 3, an extension direction of the first auxiliary signal line F1 intersects with an extension direction of the first reset signal line R1, and the first auxiliary signal line F1 is electrically connected to at least two first reset signal lines R1. It should be noted that the signal line in an embodiment of the present disclosure can be in a shape of straight line or curved line, and the extension direction of the signal line refers to a substantial extension direction of the signal line. FIG. 3 shows that the first auxiliary signal line F1 is electrically connected to the first reset signal line R1 through a via V0. In addition, FIG. 3 further shows a first electrode plate C1 and a second electrode plate C2 of the storage capacitor C. The pixel circuit is connected to the first electrode of the light-emitting device 10 through a via V1. FIG. 3 also schematically shows a first electrode 11. The first electrode 11 is also shown in FIG. 5, FIG. 12, FIG. 19, and FIG. 21 in the following embodiments. A shape of the first electrode 11 is only exemplarily illustrated and is not limited herein by the present disclosure. In other embodiments, such as embodiments shown in FIG. 4, FIG. 10 and FIG. 11, the first electrode of the light-emitting device is not shown in order to simplify the schematic diagram.

In this embodiment, the first auxiliary signal line F1 is electrically connected to the first reset signal line R1, thereby reducing the voltage drop on the first reset signal line, improving the brightness uniformity of the display area, and further improving the display effect. In addition, power consumption of the display panel can be reduced to a certain extent.

FIG. 3 further shows a capacitance plate ZD, which is connected to the power line P through a via. The threshold compensation transistor T2 is a double-gate transistor. As can be seen from FIG. 3, the capacitance plate ZD overlaps with a middle node N2 of two transistors of the threshold compensation transistor T2 to form a capacitor, so that a potential of the node N2 can be stabilized, and when the pixel circuit operates in the light-emitting phase, the current leaking from the threshold compensation transistor T2 to the control terminal of the driving transistor Tm can be reduced, thereby stabilizing the potential of the control terminal of the driving transistor Tm, so as to achieve a stable driving current.

Figure 4:
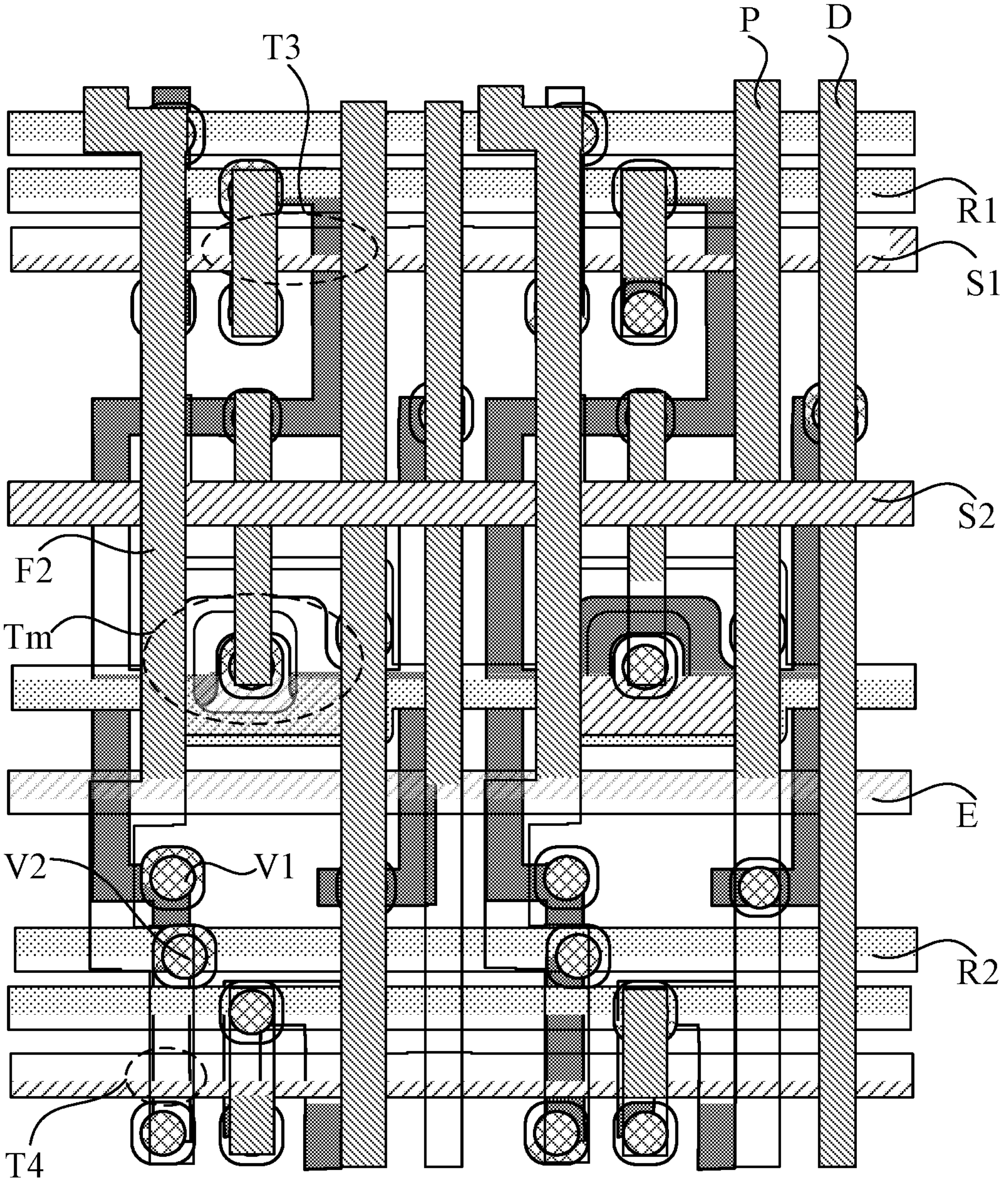
FIG. 4 is a schematic diagram of a display panel according to another embodiment of the present disclosure.

In another embodiment, the auxiliary signal lines include a second auxiliary signal line, which intersects with and is electrically connected to the second reset signal line R2. FIG. 4 is a schematic diagram of a display panel according to another embodiment of the present disclosure, as shown in FIG. 4, only some of the transistors of the pixel circuit are shown in FIG. 4, and other structures can be understood with reference to FIG. 2 and FIG. 3. As shown in FIG. 4, an extension direction of the second auxiliary signal line F2 intersects with an extension direction of the second reset signal line R2, and the second auxiliary signal line F2 is electrically connected to at least two second reset signal lines R2. FIG. 4 shows that the second auxiliary signal line F2 is electrically connected to the second reset signal line R2 through a via V2. In this embodiment, the second auxiliary signal line F2 is electrically connected to the second reset signal line R2, thereby reducing the voltage drop on the second reset signal line, improving the brightness uniformity of the display area, and further improving the display effect. In addition, power consumption of the display panel can be reduced to a certain extent.

Figure 5:
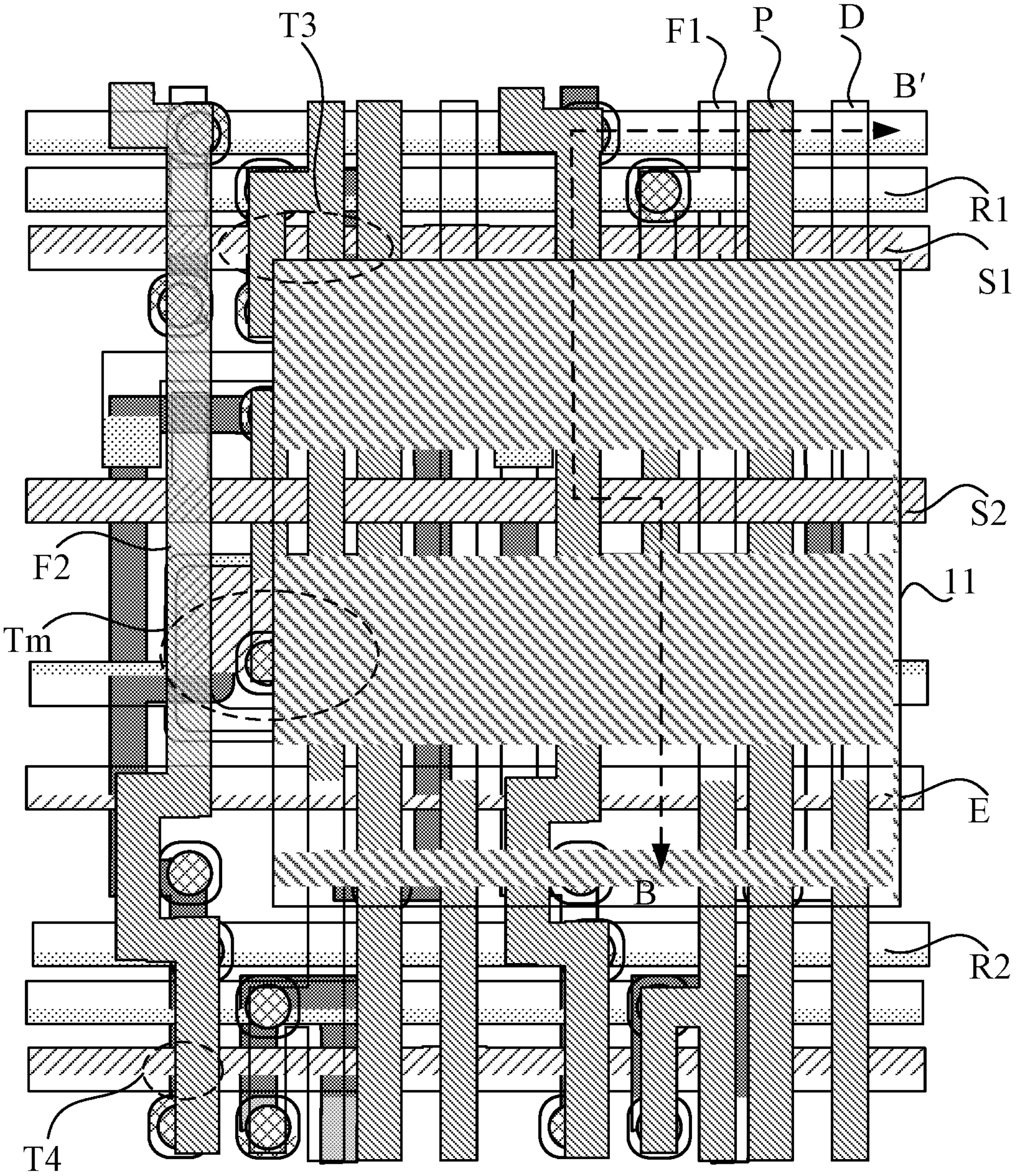
FIG. 5 is a schematic diagram of a display panel according to another embodiment of the present disclosure.

FIG. 5 is a schematic diagram of a display panel according to another embodiment of the present disclosure. In another embodiment, as shown in FIG. 5, the display panel includes a first auxiliary signal line F1 and a second auxiliary signal line F2, the first auxiliary signal line F1 intersects with and is electrically connected to the first reset signal line R1, and the second auxiliary signal line F2 intersects with and is electrically connected to the second reset signal line R2. In this embodiment, the first auxiliary signal line F1 is provided to reduce the voltage drop on the first reset signal line, and the second auxiliary signal line F2 is provided to reduce the voltage drop on the second reset signal line, thereby further improving the brightness uniformity of the display area and reducing power consumption of the display panel to a certain extent. FIG. 5 further schematically shows the first electrode 11 of the light-emitting device.

In an embodiment of the present disclosure, the first reset signal line R1 and the second reset signal line R2 are provided to reset a gate of the driving transmitter Tm and the first electrode of the light-emitting device, respectively, and the voltage of the first reset signal transmitted by the first reset signal line R1 is higher than the voltage of the second reset signal transmitted by the second reset signal line R2. A higher reset voltage is provided to the control terminal of the driving transformer Tm through the first reset signal line R1, thereby making the threshold of the control terminal of the driving transformer Tm be captured faster, so that the response time for data writing and threshold capturing is optimized. That is, the time for writing the data and the response time for capturing the threshold are shortened. When applying to high-frequency display, the time for capturing the threshold of the control terminal of the driving transistor Tm is short, and after the response time is reduced, the threshold can be captured more accurately, thereby improving the display effect of high-frequency display, and thus meeting the display requirements of high-frequency application scenarios such as cellphone competitive games. Meanwhile, a lower reset voltage signal is provided to the first electrode of the light-emitting device through the second reset signal line R2, thereby reducing undesired light emitted by the light-emitting device, and thus improving the display effect at a low gray scale. In addition, in the embodiments of the present disclosure, the auxiliary signal lines are provided, and the auxiliary signal lines can reduce a voltage drop of a transmitted reset signal, thereby improving the brightness uniformity of the display area, further improving the display effect, and reducing power consumption of the display panel to a certain extent.

In some embodiments, an extension direction of the first reset signal line R1 is the same as an extension direction of the second reset signal line R2. In an embodiment, the extension direction of the first reset signal line R1 and the extension direction of the second reset signal line R2 are the same as an extension direction of the scan line (first scan line and second scan line). In another embodiment, the extension direction of the first reset signal line R1 and the extension direction of the second reset signal line R2 are the same as an extension direction of the data line D. Due to a large number of signal lines in the display panel, extension directions of the various signal lines and layers where the various signal lines are located can be arranged appropriately.

Figure 6:
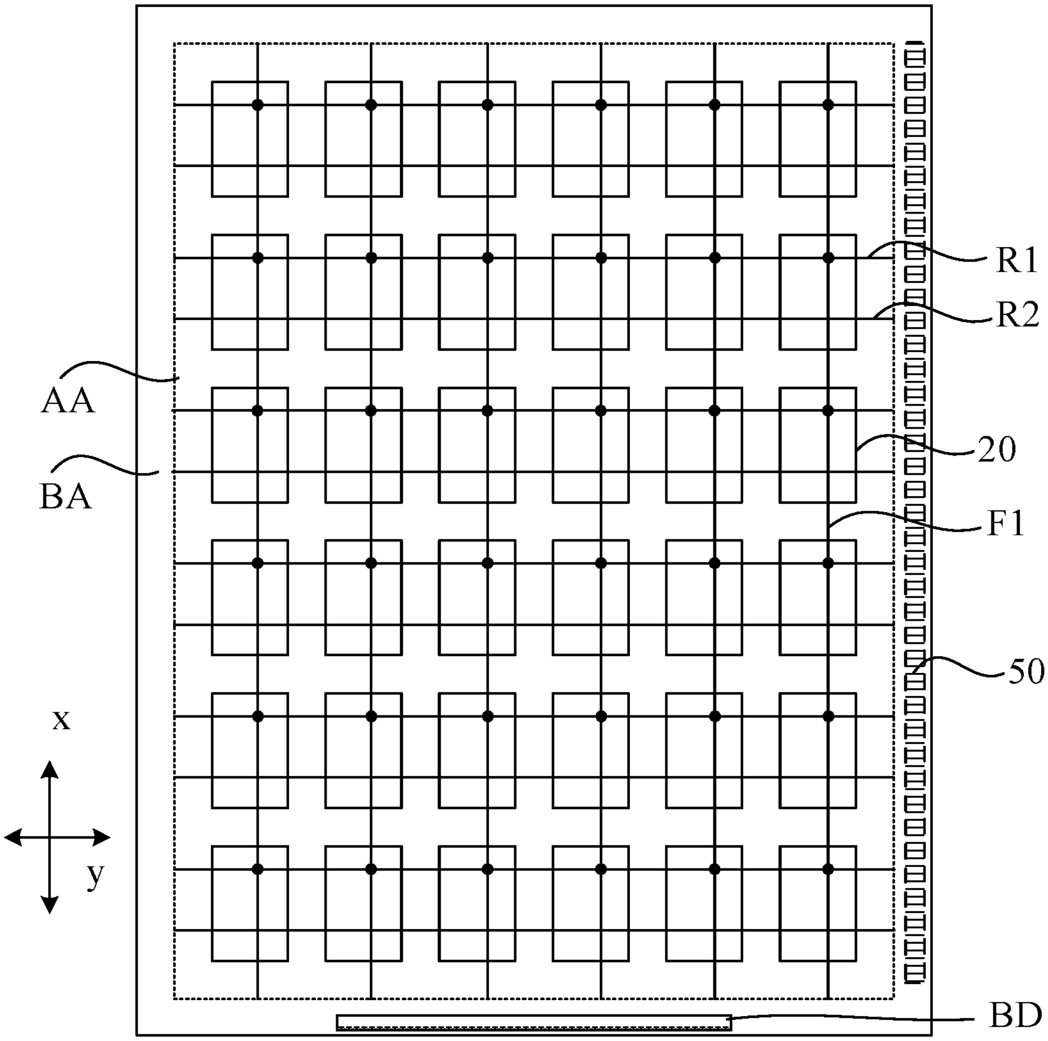
FIG. 6 is a simplified schematic diagram of a display panel according to another embodiment of the present disclosure.

In an embodiment of the present disclosure, the first reset signal line R1 is electrically connected to all pixel circuits in a pixel circuit row arranged in the extension direction of the first reset signal line R1, so as to provide a first reset signal to all the pixel circuits in the pixel circuit row; similarly, the second reset signal line R2 is electrically connected to all pixel circuits in a pixel circuit row arranged in the extension direction of the second reset signal line R2, so as to provide a second reset signal to all the pixel circuits in the pixel circuit row. That is, each of the first reset signal line R1 and the second reset signal line R2 substantially passes through the display area of the display panel in the respective extension direction. FIG. 6 is a simplified schematic diagram of a display panel according to another embodiment of the present disclosure. As shown in FIG. 6, taking the first auxiliary signal line F1 as an example, the first auxiliary signal line F1 intersects with all first reset signal line R1. The display panel has the display area AA and a non-display area BA, and the pixel circuit 20 is shown as a block in FIG. 6. It can be seen that the extension direction of the first reset signal line R1 is the same as the extension direction of the second reset signal line R2, and each of the first reset signal line R1 and the second reset signal line R2 substantially passes through the display area in the respective extension direction. The first auxiliary signal line F1 intersects with and is electrically connected to the first reset signal line R1. In this embodiment, the first reset signal lines R1 intersect with the first auxiliary signal lines F1, thereby forming grid structures, which can reduce the voltage drop on the first reset signal line.

The non-display area BA of the display panel further includes a binding area BD as shown in FIG. 6, and the binding area BD is configured to bind a driving chip or a flexible circuit board. The binding area BD is located at a side of the display area AA in a first direction x, and binding terminals arranged in a second direction y are provided in the binding area BD. In an embodiment of the present disclosure, the second direction y is perpendicular to the first direction x. FIG. 6 further shows a driving circuit 50, which for example is arranged at a side of the display area AA in the second direction y. The driving circuit 50 includes a plurality of shift registers arranged in the first direction x. In an embodiment, the driving circuits 50 is provided at two sides of the display area AA in the second direction y (i.e., the non-display area at a left side and at a right side shown in FIG. 6).

FIG. 6 shows that each of the first reset signal line R1 and the second reset signal line R2 extends along the second direction y, i.e., the extension direction of the first reset signal line R1 and the extension direction of the second reset signal line R2 are the same as a direction along which the binding terminals in the binding area BD are arranged. In the embodiment corresponding to FIG. 6, the first auxiliary signal line F1 extends along the first direction x, i.e., the extension direction of the first auxiliary signal line F1 is the same as a direction along which the shift registers in the driving circuit 50 are arranged.

In an embodiment, on the basis of the embodiment corresponding to FIG. 6, the display panel further includes a second auxiliary signal line, and an extension direction of the second auxiliary signal line is the same as the direction along which the shift registers in the driving circuit 50 are arranged.

In an embodiment, the extension direction of the first reset signal line R1 intersects with the extension direction of the second reset signal line R2, the extension direction of the first reset signal line R1 is the same as the direction along which the binding terminals in the binding area of the display panel are arranged, and the extension direction of the second reset signal line R2 is the same as the direction along which the shift registers in the driving circuit are arranged. In a case where the display panel further includes a first auxiliary signal line F1, an extension direction of the first auxiliary signal line F1 is the same as the extension direction of the second reset signal line R2. In a case where the display panel further includes a second auxiliary signal line F2, an extension direction of the second auxiliary signal line F2 is the same as the extension direction of the first reset signal line R1.

In another embodiment, the extension direction of the first reset signal line R1 intersects with the extension direction of the second reset signal line R2, the extension direction of the first reset signal line R1 is the same as a direction along which the shift registers in the driving circuit are arranged, and the extension direction of the second reset signal line R2 is the same as a direction along which the binding terminals in the binding area of the display panel are arranged. In a case where the display panel further includes a first auxiliary signal line F1, an extension direction of the first auxiliary signal line F1 is the same as the extension direction of the second reset signal line R2. In a case where the display panel further includes a second auxiliary signal line F2, an extension direction of the second auxiliary signal line F2 is the same as the extension direction of the first reset signal line R1.

In another embodiment, the extension direction of the first reset signal line R1 is the same as the extension direction of the second reset signal line R2, and both the extension direction of the first reset signal line R1 and the extension direction of the second reset signal line R2 are the same as a direction along which the shift registers in the driving circuit are arranged, which will not be illustrated in accompanying drawings.

Figure 7:
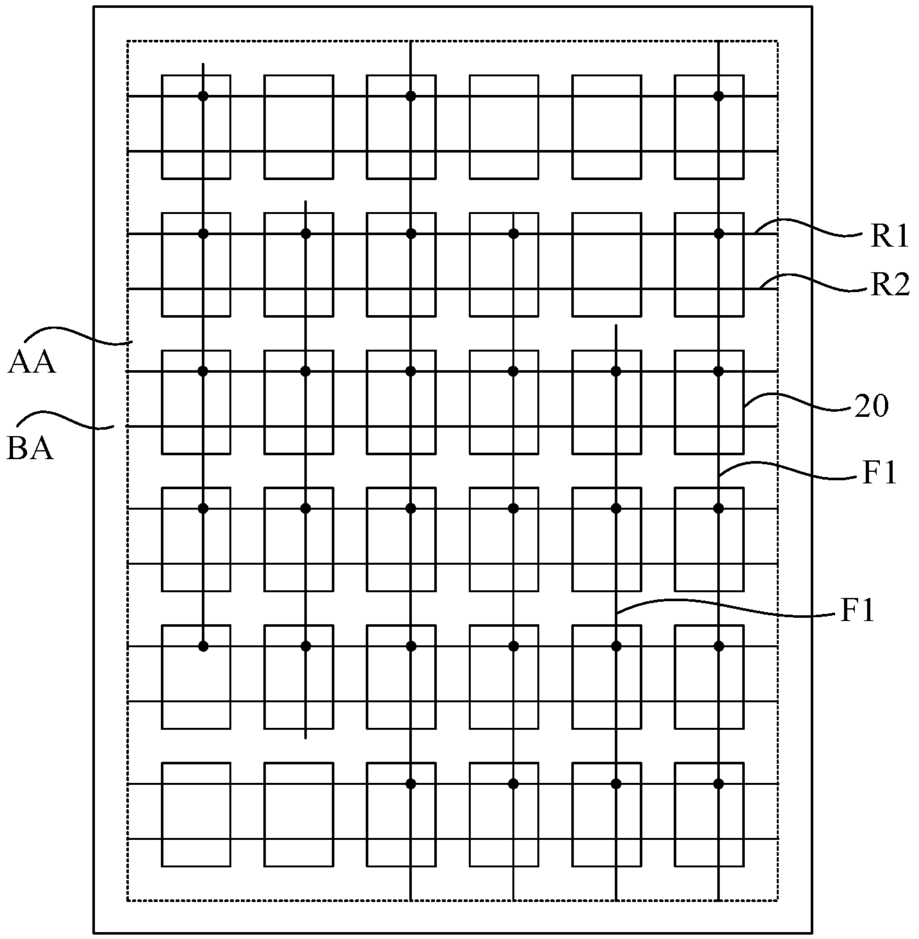
FIG. 7 is a simplified schematic diagram of a display panel according to another embodiment of the present disclosure.

FIG. 7 is a simplified schematic diagram of a display panel according to another embodiment of the present disclosure. In another embodiment, as shown in FIG. 7, the extension direction of the first reset signal line R1 is the same as the extension direction of the second reset signal line R2, and the first auxiliary signal lines F1 in the display panel have different lengths. In an embodiment of the present disclosure, some of the first auxiliary signal lines F1 intersect with only some of the first reset signal lines R1 that are arranged in the extension direction of the first auxiliary signal line F1, which can achieve that the first auxiliary signal lines are used to reduce the voltage drop of the transmitted first reset signal.

Figure 8:
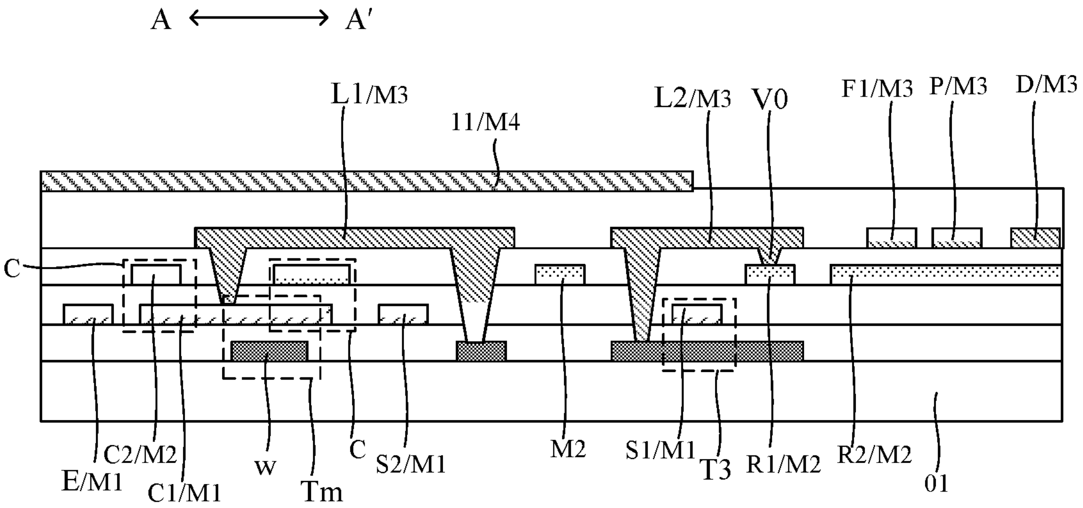
FIG. 8 is a schematic cross-sectional view along A-A' shown in FIG. 3 according to an embodiment of the present disclosure.

In a case where the extension direction of the first reset signal line R1 is the same as the extension direction of the second reset signal line R2, the first reset signal line R1 and the second reset signal line R2 can be located in a same layer. FIG. 8 is a schematic cross-sectional view along A-A' shown in FIG. 3. As shown in FIG. 8, the display panel can include a substrate 01; and a semiconductor layer w, a first metal layer M1, a second metal layer M2, a third metal layer M3 and a fourth metal layer M4 that are sequentially arranged on the substrate along a direction away from the substrate 01. In an example, the first metal layer M1 and the second metal layer M2 are made of a same material including molybdenum. The third metal layer M3 is made of a material including titanium or aluminum, or is a triple-layer structure (titanium-aluminum-titanium). The fourth metal layer M4 is made of a material including silver or magnesium, or is a triple-layer structure (indium tin oxide-silver-indium tin oxide). The driving transistor Tm includes a channel, which is formed in the semiconductor layer w. The storage capacitor C includes a first electrode plate C1 located in the first metal layer M1 and a second electrode plate C2 located in the second metal layer M2. The data line D and the power line P are located in the third metal layer M3. The light-emitting device 10 includes a first electrode 11, a light-emitting layer and a second electrode that are stacked on the substrate 01. Only the first electrode 11 is shown in FIG. 8 where the first electrode 11 is located in the fourth layer M4. In this embodiment, the extension direction of the first reset signal line R1 and the extension direction of the second reset signal line R2 are the same as an extension direction of the scan line, and both the first reset signal line R1 and the second reset signal line R2 are located in the second metal layer M2. The extension direction of the first auxiliary signal line F1 is the same as the extension direction of the data line D, and the first auxiliary signal line F1 is located in the third metal layer M3.

FIG. 8 further shows a first connection line L1 and a second connection line L2, which are located in the third metal layer M3. The first connection line L1 is provided so that the control terminal of the driving transistor Tm is electrically connected to the second terminal of the first reset transistor T3, and the second connection line L2 is provided so that the first terminal of the first reset transistor T3 is electrically connected to the first reset signal line R1.

Figure 9:
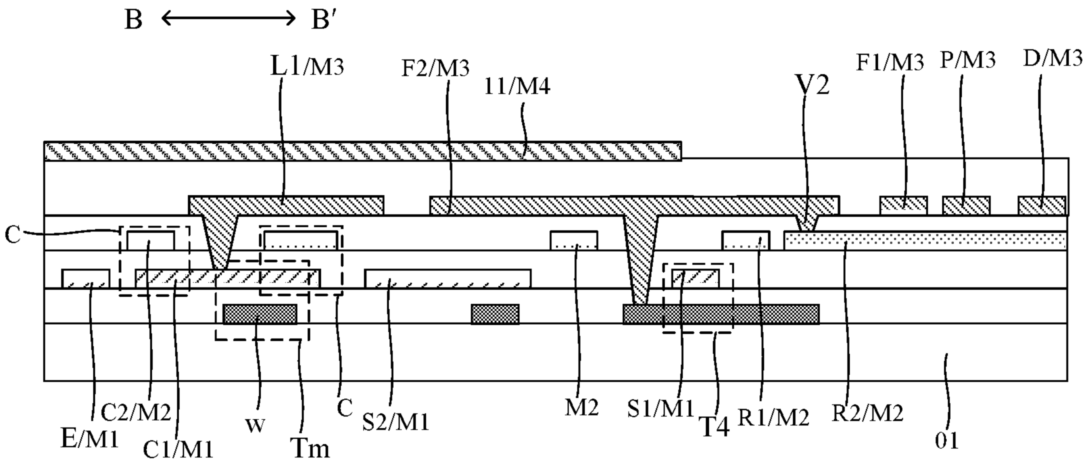
FIG. 9 is a schematic cross-sectional view along B-B' shown in FIG. 5 according to an embodiment of the present disclosure.

FIG. 9 is a schematic cross-sectional view along B-B' shown in FIG. 5. In an embodiment, as shown in FIG. 9, the second auxiliary signal line F2 is located in the third metal layer M3. In this embodiment, the first reset signal line R1 and the second reset signal line R2 are located in a same layer, and the second auxiliary signal line F2 and the first auxiliary signal line F1 are located in a same layer.

In another embodiment, the first reset signal line R1 and the second reset signal line R2 are located in the first metal layer M1, and the first auxiliary signal line F1 and the data line D are located in the third metal layer M3, and this case will not be further illustrated herein.

In another embodiment, the first reset signal line R1 and the second reset signal line R2 are located in the first metal layer M1, and the first auxiliary signal line F1 and the second auxiliary signal line F2 are located in the third metal layer M3, and this case will not be further illustrated herein.

In another embodiment, at least one of the first reset signal line R1 or the second reset signal line R2 is located in the fourth metal layer M4. For example, the first reset signal line R1 is located in the fourth metal layer M4, then the first reset signal line R1 and the first electrode 11 are located in a same layer, and in order to make the first reset signal line R1 be insulated from the first electrode 11, the first reset signal line R1 can be arranged between adjacent first electrodes 11. In other words, the first reset signal line R1 can be kept away from the first electrode 11. Reference can be made herein to the illustration in the following embodiment corresponding to FIG. 19, where the first reset signal line R1 and the first electrode 11 are both located in the fourth metal layer M4, and in a local area illustrated in FIG. 19, the first reset signal line R1 is kept away from the first electrode 11.

Figure 10:
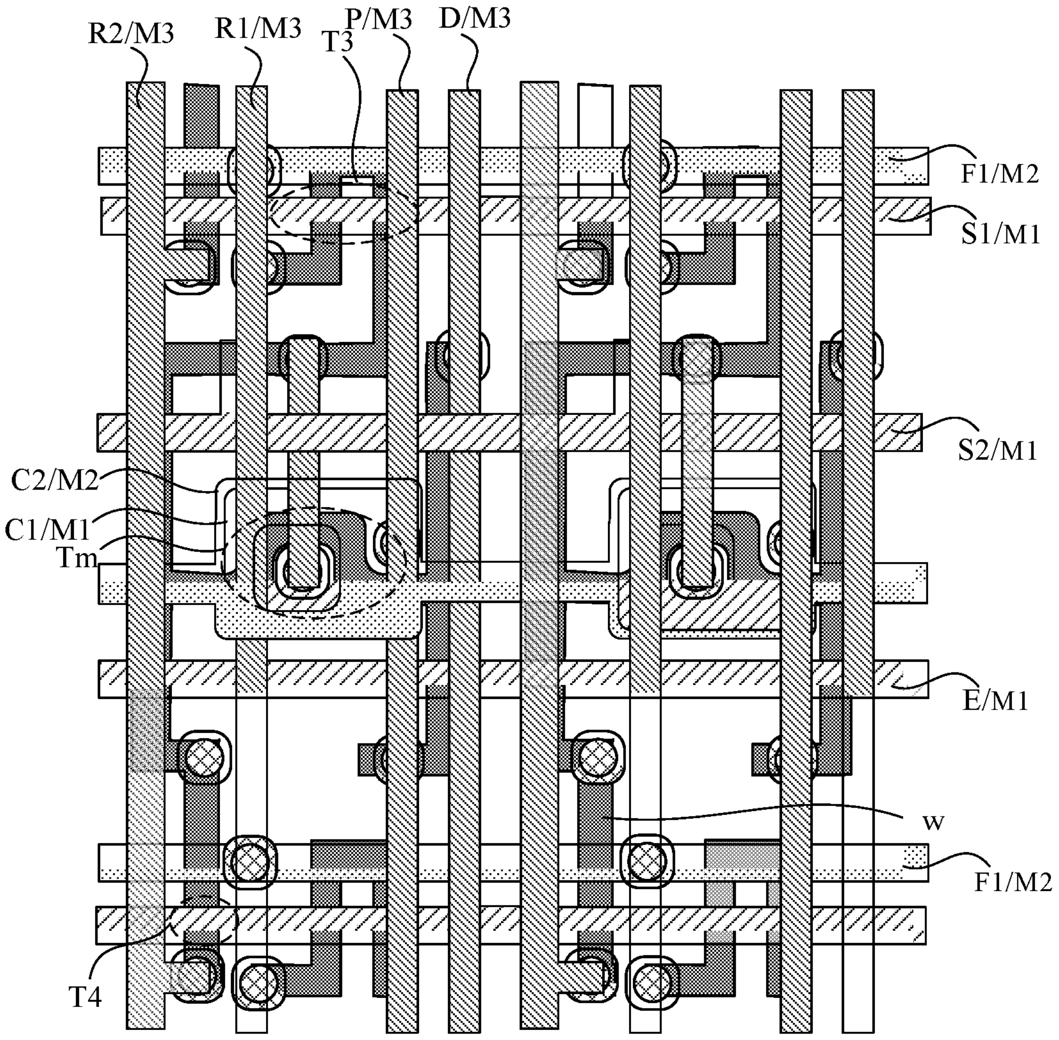
FIG. 10 is a schematic diagram of a display panel according to another embodiment of the present disclosure.

FIG. 10 is a schematic diagram of a display panel according to another embodiment of the present disclosure. In an embodiment, as shown in FIG. 10, the extension direction of the first reset signal line R1 and the extension direction of the second reset signal line R2 are the same as the extension direction of the data line D, and both the first reset signal line R1 and the second reset signal line R2 are located in the third metal layer M3. FIG. 10 further shows the first auxiliary signal line F1 that intersects with and is electrically connected to the first reset signal line R1. FIG. 10 shows that the first auxiliary signal line F1 is located in the second metal layer M2.

In another embodiment, the first reset signal line R1, the second reset signal line R2, and the data line D are located in a same layer, and the first auxiliary signal line F1 is located in the first metal layer M1. In still another embodiment, the first auxiliary signal line F1 can be located in the fourth metal layer M4.

Based on the embodiment corresponding to FIG. 10, the display panel can further include a second auxiliary signal line F2. In an embodiment, the second auxiliary signal line F2 and the first auxiliary signal line F1 are located in a same layer. In another embodiment, the second auxiliary signal line F2 and the first auxiliary signal line F1 are located in any two of the first metal layer M1, the second metal layer M2, and the fourth metal layer M4, respectively.

Figure 11:
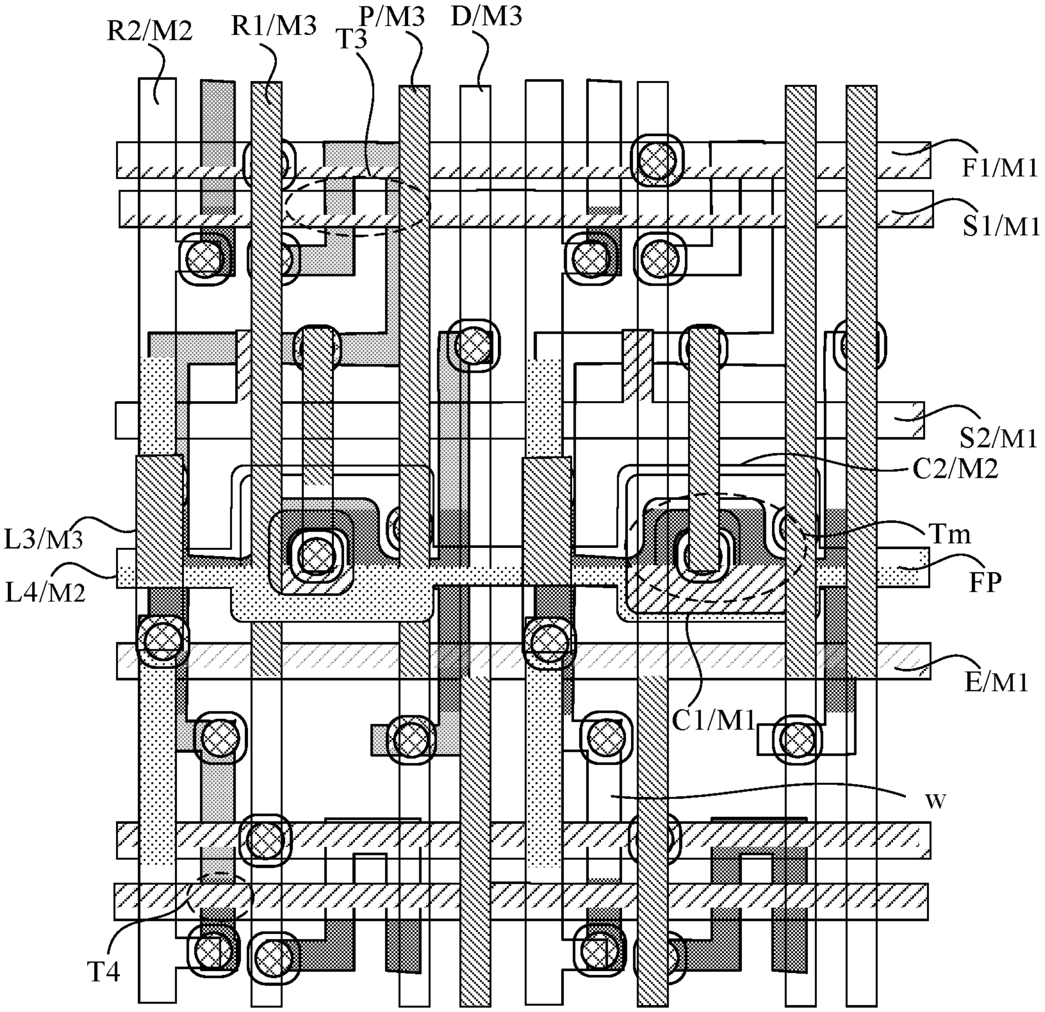
FIG. 11 is a schematic diagram of a display panel according to another embodiment of the present disclosure.

FIG. 11 is a schematic diagram of a display panel according to another embodiment of the present disclosure. In an embodiment, as shown in FIG. 11, the extension direction of the first reset signal line R1 is the same as the extension direction of the second reset signal line R2, and is also the same as the extension direction of the data line D. In an example, part of the second reset signal line R2 is located in the second metal layer M2, and the second reset signal line R2 further includes a third connection line L3, which is a cross-bridge connection line. In the wiring structure of the pixel circuit, the second electrode plate C2 of the storage capacitor is located in the second metal layer M2, and the power line P is electrically connected to the second electrode plate C2. For example, the second electrode plates C2 of two adjacent storage capacitors are electrically connected to each other through the fourth connection line L4 which is located in the same layer as the second electrode plates C2 of two adjacent storage capacitors. In this way, multiple second electrode plates C2 are connected to each other to form an auxiliary power line FP for transmitting a power signal, and the auxiliary power line FP intersects with and is electrically connected to the power line P, thereby reducing the voltage drop of the transmitted power signal, thus improving the brightness uniformity of the display area and further improving the display effect. In this case, the extension direction of the secondary power line FP intersects with the extension direction of the secondary reset signal line R2, and in this embodiment, the third connection line L3 is provided so that the secondary reset signal line R2 and the secondary power line FP are insulated from each other, and thus the pixel circuit can work normally with reasonable wiring.

In an embodiment, the third connection line L3 is located in the third metal layer M3, and the third connection line L3 can be made in the same process as the data line D and the power line P. In addition, in the embodiment corresponding to FIG. 11, it is further shown that the first reset signal line R1 is located in the third metal layer M3, and the first reset signal line R1 is electrically connected to the first auxiliary signal line F1 located in the first metal layer M1. In another embodiment, the first auxiliary signal line F1 can be located in the fourth metal layer M4 or the second metal layer M2.

In the embodiment corresponding to FIG. 11, the extension direction of the first reset signal line R1 is the same as the extension direction of the second reset signal line R2, and the first reset signal line R1 and the second reset signal line R2 are located in different metal layers. With such configuration where the first reset signal line R1 and the second reset signal line R2 are located in different metal layers, the number of signal lines having the same extension direction in the same metal layer can be reduced, thereby saving the space for wiring of the display panel, and thus increasing a light transmission rate of the display panel to a certain extent. In the case of under-screen optical module solutions (e.g., under-screen camera, under-screen fingerprint recognition), the optical performance of the optical module can be improved.

In another embodiment, both the first reset signal line R1 and the second reset signal line R2 are located in the second metal layer M2, and both the extension direction of the first reset signal line R1 and the extension direction of the second reset signal line R2 are the same as the extension direction of the data line D. In this case, a cross-bridge line (i.e., the third connection line L3), similar to the cross-bridge line in the embodiment corresponding to FIG. 11, can be provided at a location where the first reset signal line R1 intersects with the auxiliary power line FP in the extension direction of the first reset signal line R1, so as to make the first reset signal line R1 and the auxiliary power line FP be insulated from each other.

In some embodiments, the display panel further includes a functional metal layer, which is located between the second metal layer and the third metal layer, and the functional metal layer can also be provided with part of the signal lines therein.

Figure 12:
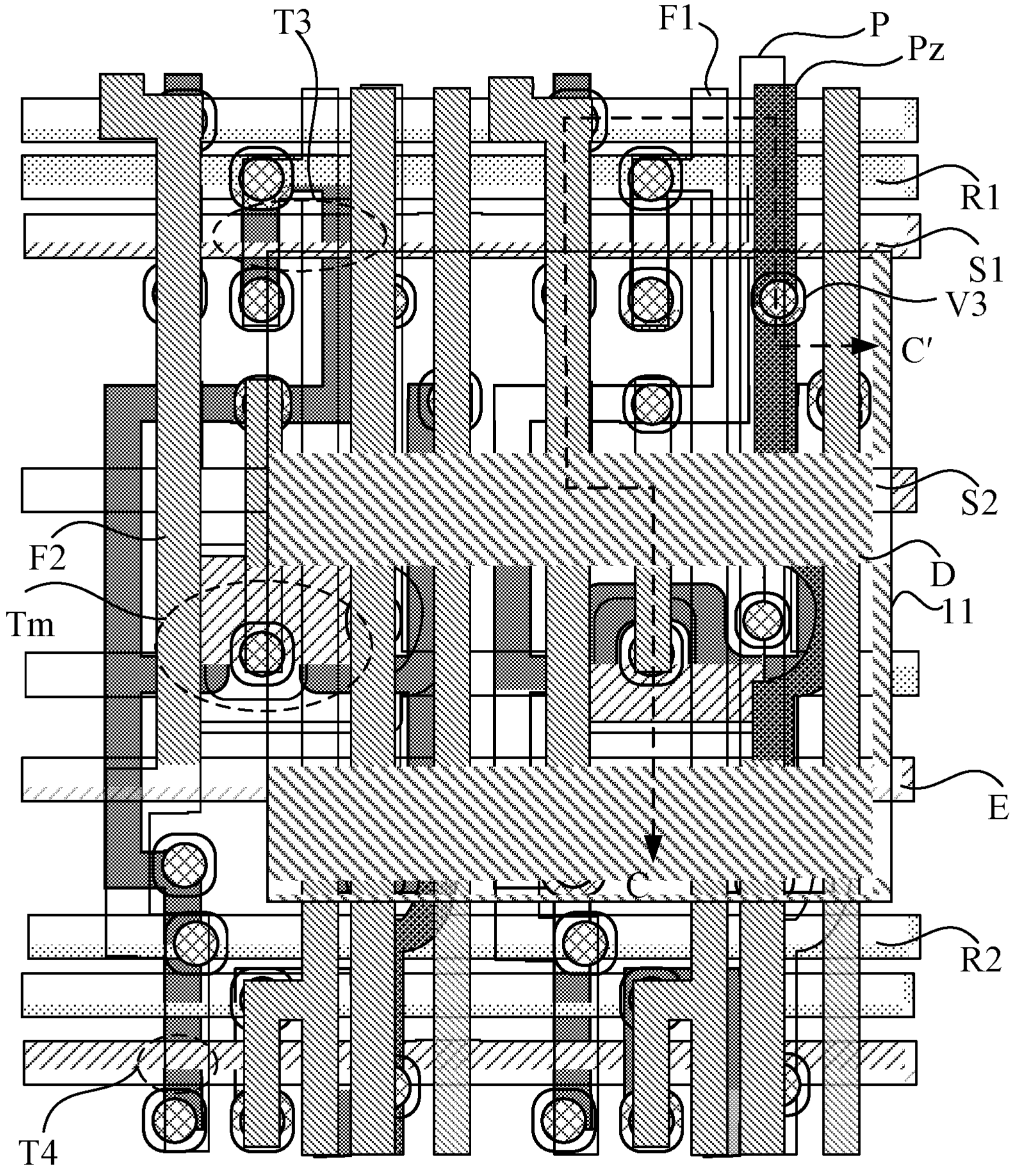
FIG. 12 is a schematic diagram of a display panel according to another embodiment of the present disclosure.
Figure 13:
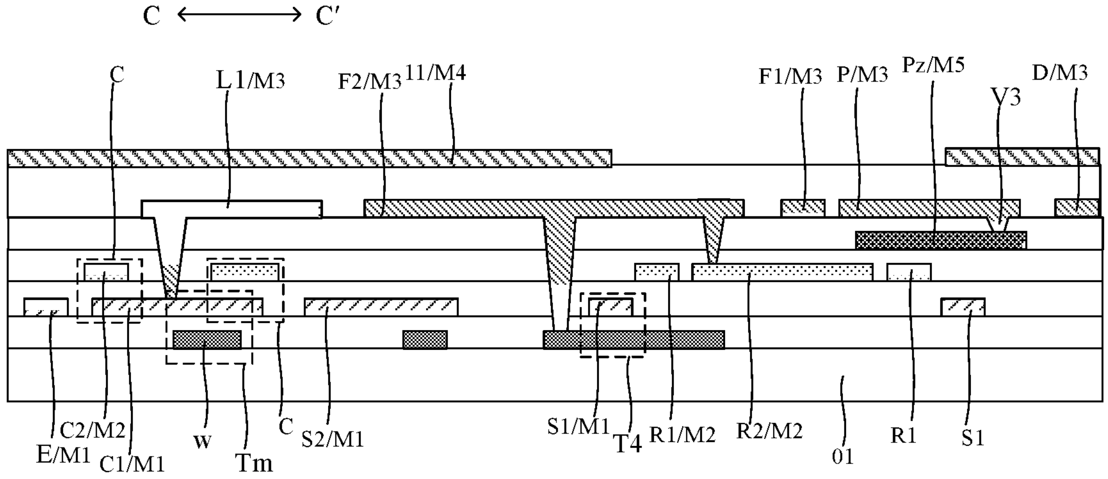
FIG. 13 is a schematic cross-sectional view along C-C' shown in FIG. 12 according to an embodiment of the present disclosure.

FIG. 12 is a schematic diagram of a display panel according to another embodiment of the present disclosure. FIG. 13 is a schematic cross-sectional view along C-C' shown in FIG. 12. In the embodiment corresponding to FIG. 12, the extension direction of the first reset signal line R1 is the same as the extension direction of the second reset signal line R2, and both the first reset signal line R1 and the second reset signal line R2 are located in the second metal layer M2; the extension direction of the first auxiliary signal line F1 is the same as the extension direction of the second auxiliary signal line F2, and both the first auxiliary signal line F1 and the second auxiliary signal line F2 are located in the third metal layer M3; and the first auxiliary signal line F1, the second auxiliary signal line F2, the data line D and the power line P are located in a same layer. As shown in FIG. 12, the display panel further includes a power sub-line Pz, which overlaps at least partially with the power line P and is electrically connected to the power line P through a via V3. As shown in FIG. 13, the power sub-line Pz is located in the functional metal layer M5, which is located between the third metal layer M3 and the second metal layer M2. In this embodiment, the power sub-line Pz is connected in parallel with the power line P. The power sub-line Pz is provided so that the voltage drop of the transmitted power signal can be reduced, thereby further improving the display brightness uniformity of the display panel, and reducing power consumption of the display panel to a certain extent.

In an embodiment, the functional metal layer M5 and the third metal layer M3 are made of a same material including titanium and aluminum. For example, each of the functional metal layer M5 and the third metal layer M3 is a triple-layer structure (titanium/aluminum/titanium).

Figure 14:
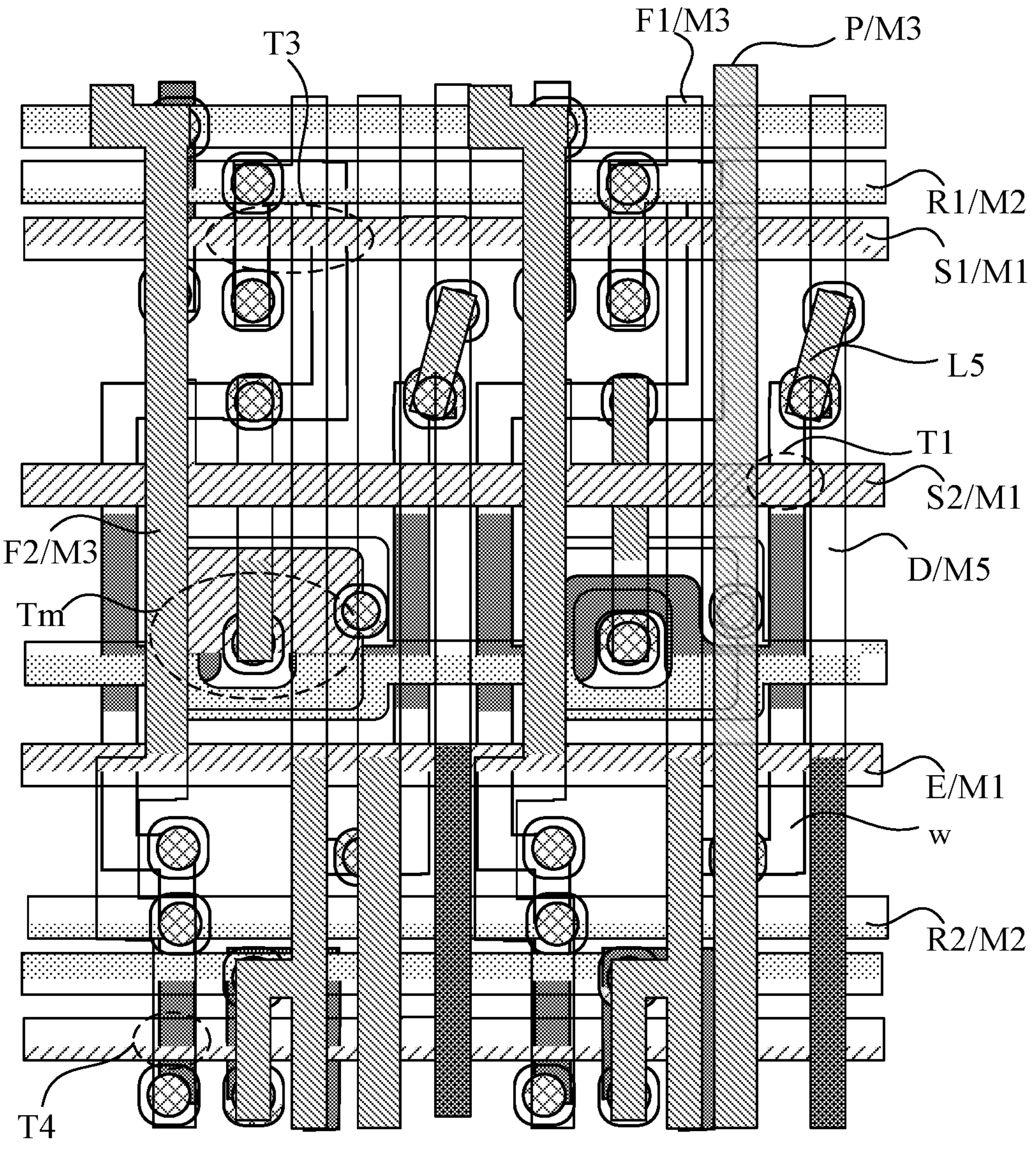
FIG. 14 is a schematic diagram of a display panel according to another embodiment of the present disclosure.

In another embodiment, the display panel further includes a functional metal layer, one of the data line and the power line is located in the third metal layer, and the other one of the data line and the power line is located in the functional metal layer. FIG. 14 is a schematic diagram of a display panel according to another embodiment of the present disclosure. A part of the embodiment corresponding to FIG. 14 that is the same as the embodiment corresponding to FIG. 12 can be understood with reference to the embodiment corresponding to FIG. 12, and a difference between the embodiment corresponding to FIG. 14 and the embodiment corresponding to FIG. 12 lies in the layers where the data line D and the power line P are located. As shown in FIG. 14, the data line D is located in the functional metal layer M5, and the power line P is located in the third metal layer M3. The display panel further includes a fifth connection line L5 located in the third metal layer M3, through which the data line D is connected to the first terminal of the data writing transistor T1. In this embodiment, the data line D and the power line P, and the first auxiliary signal line F1 and the second auxiliary signal line F2 that extend in a same direction are arranged in two metal layers, thereby reducing the number of lines located in a single metal layer, and thus saving the space for wiring of the display panel and increasing a light transmission rate of the display panel. In this case, it can also reduce interference between different signals.

In an embodiment, as shown in FIG. 14, the data line D is located in the functional metal layer M5. In another embodiment, the power line P is located in the functional metal layer M5, and the data line D is located in the third metal layer M3. In addition to the fourth metal layer M4 where the first electrode is provided, the third metal layer M3 is a metal layer located furthest from the semiconductor layer w above the substrate. In this case, the data line D is arranged in the third metal layer M3, thereby reducing an interference of signal jump on the data line D with a potential of the first node N1 to maintain stability of the potential of the first node N1 during a light-emitting phase of the driving device, and thus achieving stability of the driving current.

Figure 15:
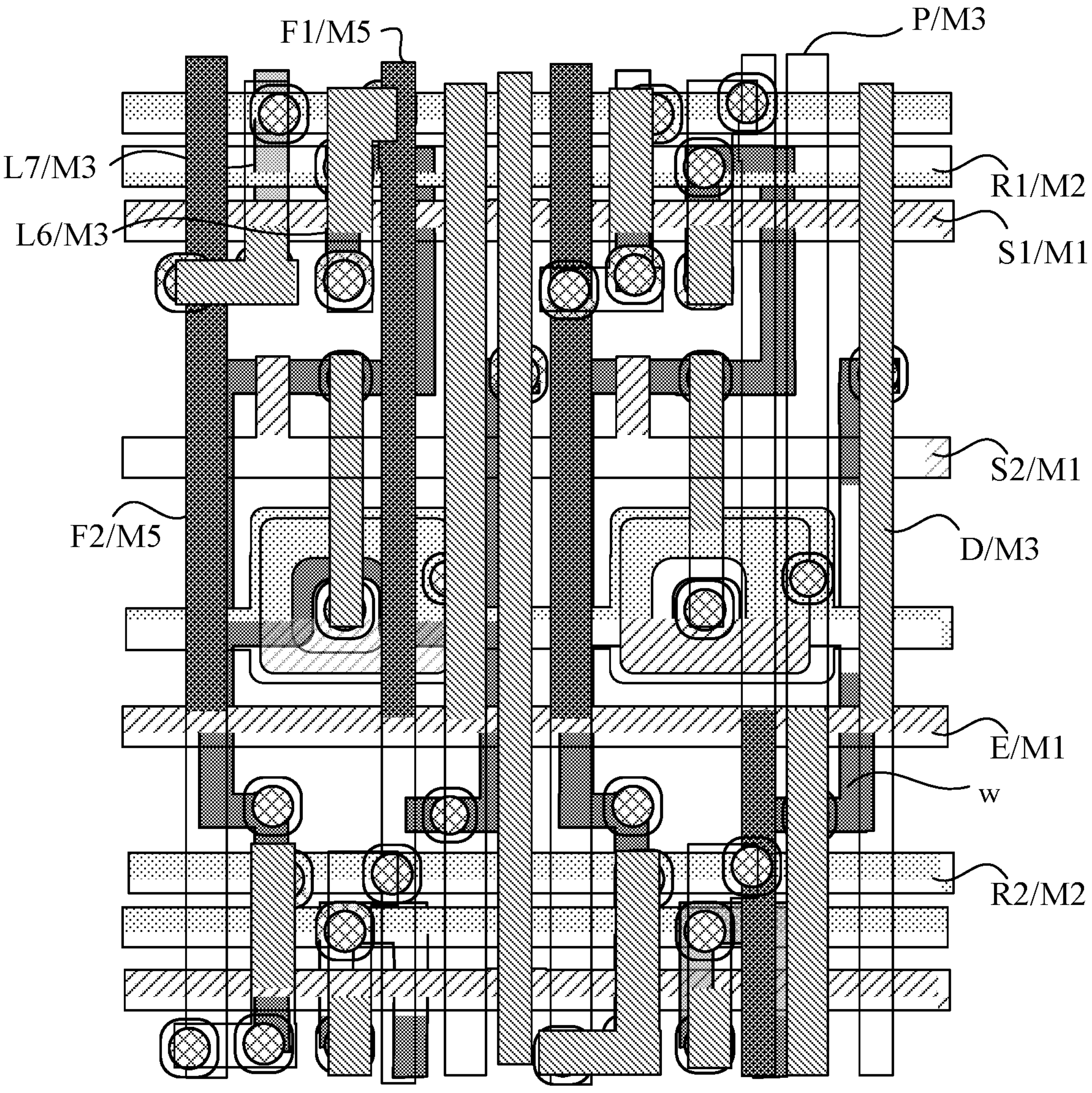
FIG. 15 is a schematic diagram of a display panel according to another embodiment of the present disclosure.

In another embodiment, the auxiliary signal line is located in the functional metal layer. FIG. 15 is a schematic diagram of a display panel according to another embodiment of the present disclosure, taking the first auxiliary signal line F1 and the second auxiliary signal line F2 of the display panel as an example, as shown in FIG. 15, both the first auxiliary signal line F1 and the second auxiliary signal line F2 are located in the functional metal layer M5. The first auxiliary signal line F1 is electrically connected to the first reset signal line R1 through the sixth connection line L6, and the second auxiliary signal line F2 is electrically connected to the second reset signal line R2 through the seventh connection line L7. Both the sixth connection line L6 and the seventh connection line L7 are located in the third metal layer M3.

In an embodiment, as shown in FIG. 15, the first auxiliary signal line F1 and the second auxiliary signal line F2 are located in a same layer; and in another embodiment, one of the first auxiliary signal line F1 and the second auxiliary signal line F2 is located in the functional metal layer M5, and the other one of the first auxiliary signal line F1 and the second auxiliary signal line F2 is located in the third metal layer M3, and this case will not be further illustrated herein with accompanying drawings.

Figure 16:
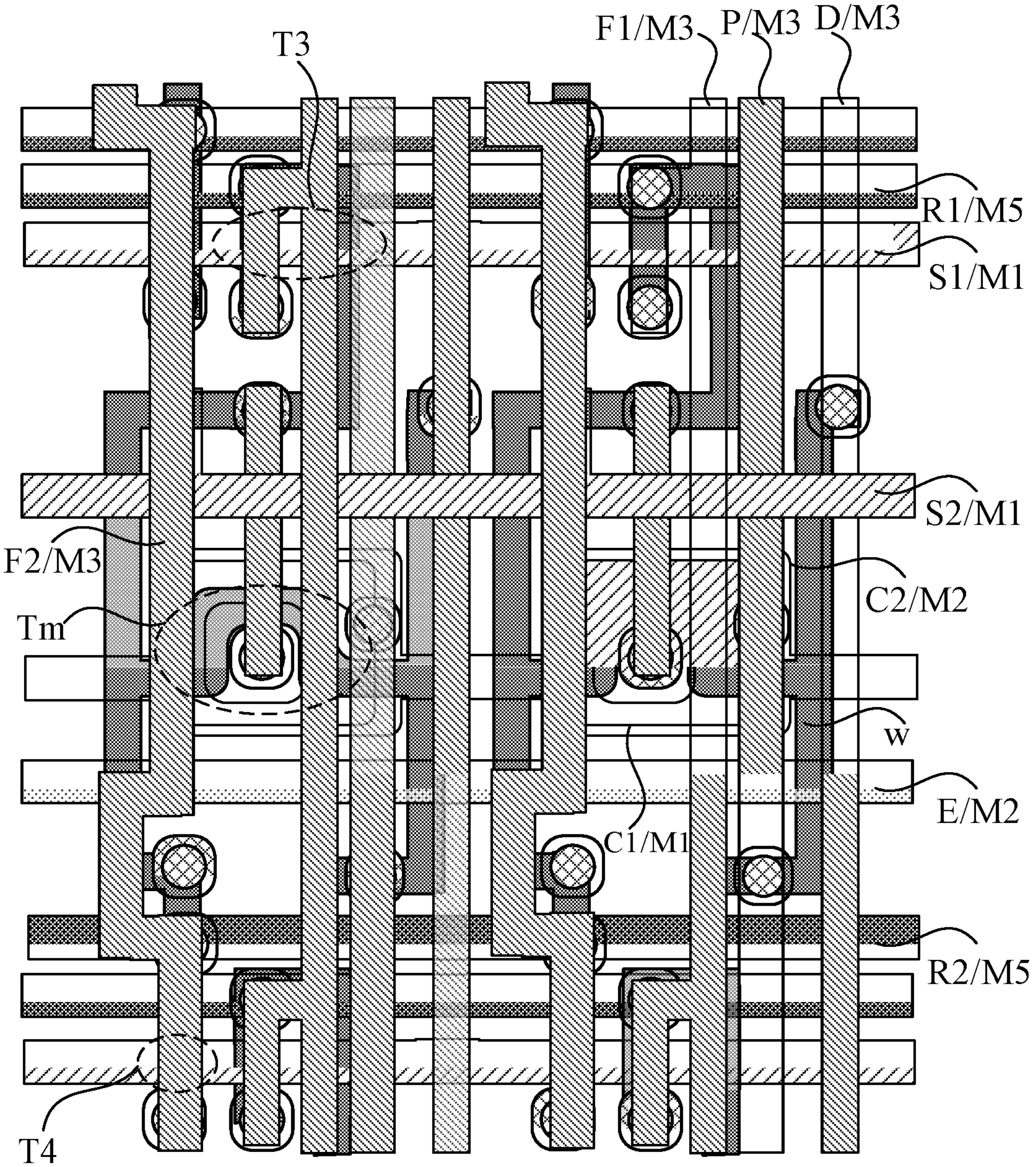
FIG. 16 is a schematic diagram of a display panel according to another embodiment of the present disclosure.

In another embodiment, the first reset signal line R1 and the second reset signal line R2 are located in the functional metal layer. FIG. 16 is a schematic diagram of a display panel according to another embodiment of the present disclosure, as shown in FIG. 16, the storage capacitor C includes a first electrode plate C1 located in the first metal layer M1, and a second electrode plate C2 located in the second metal layer M2; the first scan line S1 and the second scan line S2 are located in the first metal layer M1; the first reset signal line R1 and the second reset signal line R2 are located in the functional metal layer M5; and the data line D, the power line P, the first auxiliary signal line F1, and the second auxiliary signal line F2 are located in third metal layer M3.

In an embodiment, as shown in FIG. 16, the extension direction of the first reset signal line R1 and the extension direction of the second reset signal line R2 intersects with the extension direction of the data line D; and in another embodiment, the extension direction of the first reset signal line R1 and the extension direction of the second reset signal line R2 are the same as the extension direction of the data line D, and both the first reset signal line R1 and the second reset signal line R2 are located in the functional metal layer.

In addition, in an embodiment, as shown FIG. 6, the light-emitting control line E is located in the second metal layer M2; and in another embodiment, the light-emitting control line E is located in the first metal layer M1.

In some embodiments, the first reset signal line R1 and the second reset signal line R2 can be located in different layers. The two reset signal lines having a same extension direction are located in different layers, to avoid a scenario where too many lines are arranged in a single metal layer to affect an overall space for wiring of the pixel circuit, and to facilitate reasonable wiring. As a result, a light transmission rate of display panel can be increased, and in the case of under-screen optical module solutions, the optical performance of the optical module can be improved.

In some embodiments, the extension direction of the first reset signal line R1 and the extension direction of the second reset signal line R2 intersects with the extension direction of the data line D, and the first reset signal line R1 and second reset signal line R2 are located in any two of the first metal layer M1, the second metal layer M2, and the fourth metal layer M4.

Figure 17:
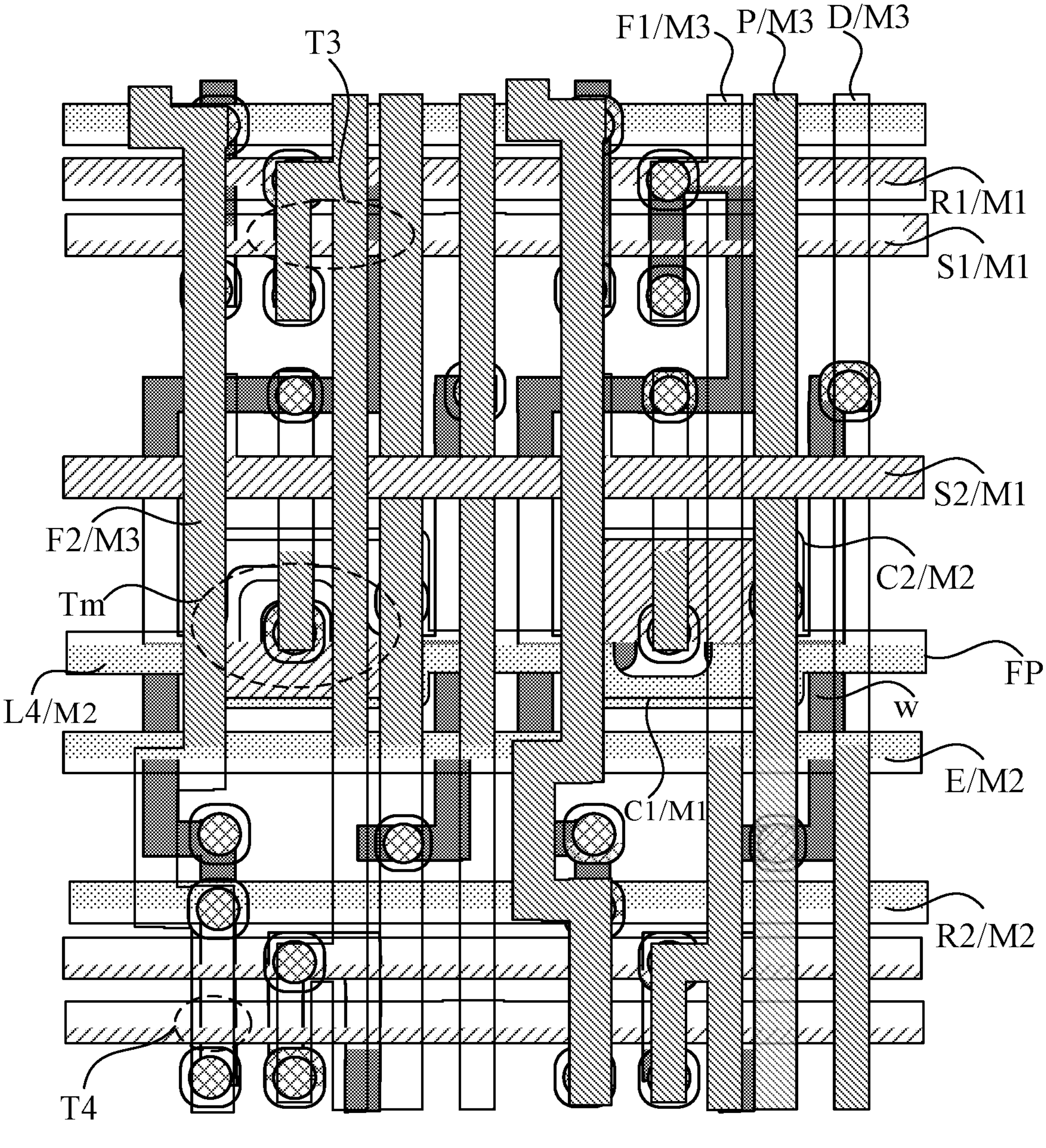
FIG. 17 is a schematic diagram of a display panel according to another embodiment of the present disclosure.

FIG. 17 is a schematic diagram of a display panel according to another embodiment of the present disclosure. In an embodiment, as shown in FIG. 17, the extension direction of the power line P is the same as the extension direction of the data line D, both the power line P and the data line D are located in the third metal layer M3, the first reset signal line R1 is located in the first metal layer M1, and the second reset signal line R2 is located in the second metal layer M2. In addition, in an embodiment, as shown in FIG. 17, the display panel includes a first auxiliary signal line F1 and a second auxiliary signal line F2 that are located in the third metal layer M3. In another embodiment, the display panel includes only the first auxiliary signal line F1 or only the second auxiliary signal line F2.

In addition, as shown in FIG. 17, the second electrode plates C2 of two adjacent storage capacitors are electrically connected to each other through the fourth connection line L4, which is located in the same layer as the second electrode plates C2 of two adjacent storage capacitors. In this way, multiple second electrode plates C2 are connected to each other to form an auxiliary power line FP for transmitting a power signal, and the auxiliary power line FP intersects with and is electrically connected to the power line P, thereby reducing the voltage drop of the transmitted power signal, thus improving the brightness uniformity of the display area and further reducing power consumption of the display panel.

In addition, in an embodiment, as shown in FIG. 17, the light-emitting control line E is located in the second metal layer M2; and in another embodiment, the light-emitting control line E is located in the first metal layer M1.

In another embodiment, the extension direction of the first reset signal line R1 and the extension direction of the second reset signal line R2 intersects with the extension direction of the data line D, one of the first reset signal line R1 and the second reset signal line R2 is located in the fourth metal layer M4 (i.e., located in the same layer as the first electrode of the light-emitting device), and the other one of the first reset signal line R1 and the second reset signal line R2 is located in the first metal layer M1 or in the second metal layer M2.

In some embodiments, the extension direction of the first reset signal line R1 and the extension direction of the second reset signal line R2 intersect with the extension direction of the data line D; the display panel further includes a functional metal layer located between the second metal layer M2 and the third metal layer M3; the first reset signal line R1, the second reset signal line R2, the power line P and the data line D are located in at least two of the first metal layer M1, the second metal layer M2, the fourth metal layer M4, or the functional metal layer M5; and at least one of the first reset signal line R1, the second reset signal line R2, the power line P, or the data line D is located in the functional metal layer.

Figure 18:
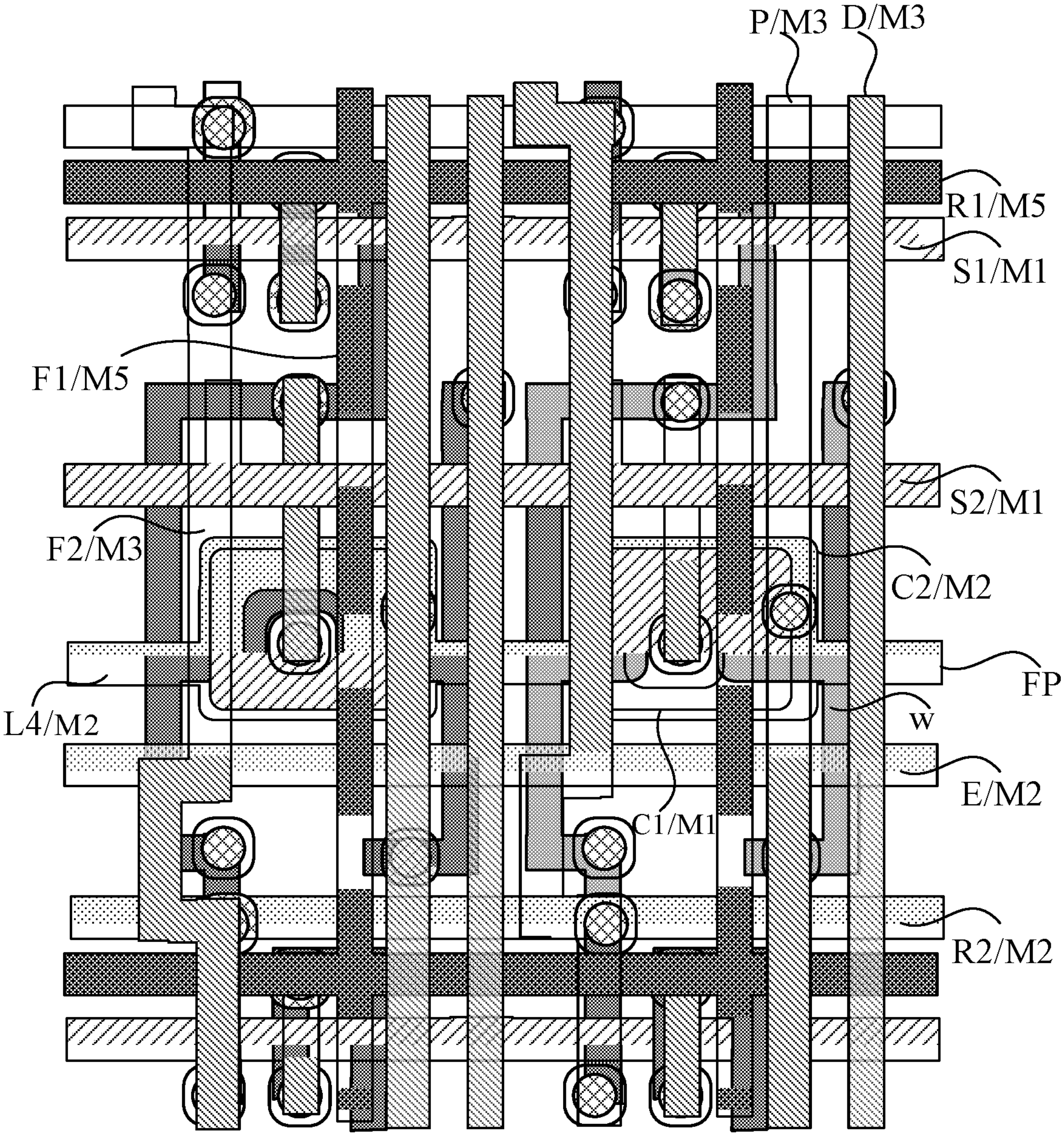
FIG. 18 is a schematic diagram of a display panel according to another embodiment of the present disclosure.

FIG. 18 is a schematic diagram of a display panel according to another embodiment of the present disclosure. In an embodiment, as shown in FIG. 18, the extension direction of the first reset signal line R1 and the extension direction of the second reset signal line R2 intersect with the expression direction of the data line D; and the extension direction of the power line P is the same as the extension direction of the data line D. The first scan line S1, the second scan line S2, and the light-emitting control line E extend in a same direction. The first scan line S1, the second scan line S2, and the first electrode plate C1 of the storage capacitor are located in the first metal layer M1; the light-emitting control line E, the second electrode plate C2 of the storage capacitor, and the second reset signal line R2 are located in the second metal layer M2; the first reset signal line R1 is located in the functional metal layer M5; the power line P and the data line D are located in the third metal layer M3; and the first electrode of the light-emitting device (not shown) is located in the fourth metal layer.

In addition, FIG. 18 further shows a first auxiliary signal line F1, and the first auxiliary signal line F1 and the first reset signal line R1 are located in a same layer. FIG. 18 further shows a second auxiliary signal line F2 located in the third metal layer M3. In this embodiment, the first auxiliary signal line F1 and the second auxiliary signal line F2 are located in different layers. In an example, the first auxiliary signal line at least overlaps with the second auxiliary signal line in a direction perpendicular to the substrate, thereby saving the space for wiring of the pixel circuit.

In an embodiment, as shown in FIG. 18, the second reset signal line R2 is located in the second metal layer M2; and in another embodiment, the second reset signal line R2 can be located in the first metal layer M1.

In an embodiment, as shown in FIG. 18, the first reset signal line R1 is located in the functional metal layer M5; and in another embodiment, the second reset signal line R2 is located in the functional metal layer M5; the first reset signal line R1 is located in the first metal layer M1, the second metal layer M2, or the fourth metal layer; the power line P and the data line D are located in the third metal layer; and the first scan line S1, the second scan line S2, and the light-emitting control line E are located in the first metal layer M1 or the second metal layer M2. In this embodiment, the second auxiliary signal line F2 and the second reset signal line R2 can be located in a same layer.

In another embodiment, the first reset signal line R1 and the second reset signal line R2 are located in different layers, one of the first reset signal line R1 and the second reset signal line R2 is located in the first metal layer M1, and the other one of the first reset signal line R1 and the second reset signal line R2 is located in the third metal layer M3. The first reset signal line R1 and the second reset signal line R2 can be located in any two of the first metal layer M1, the second metal layer M2, and the fourth metal layer M4, respectively. If the display panel further includes a first auxiliary signal line F1, the first auxiliary signal line F1 can be located in the functional metal layer M5 or the third metal layer M3. If the display panel further includes a second auxiliary signal line F2, the second auxiliary signal line F2 can be located in a layer that is the same as or different from the layer where the first auxiliary signal line F1 is located.

Figure 19:
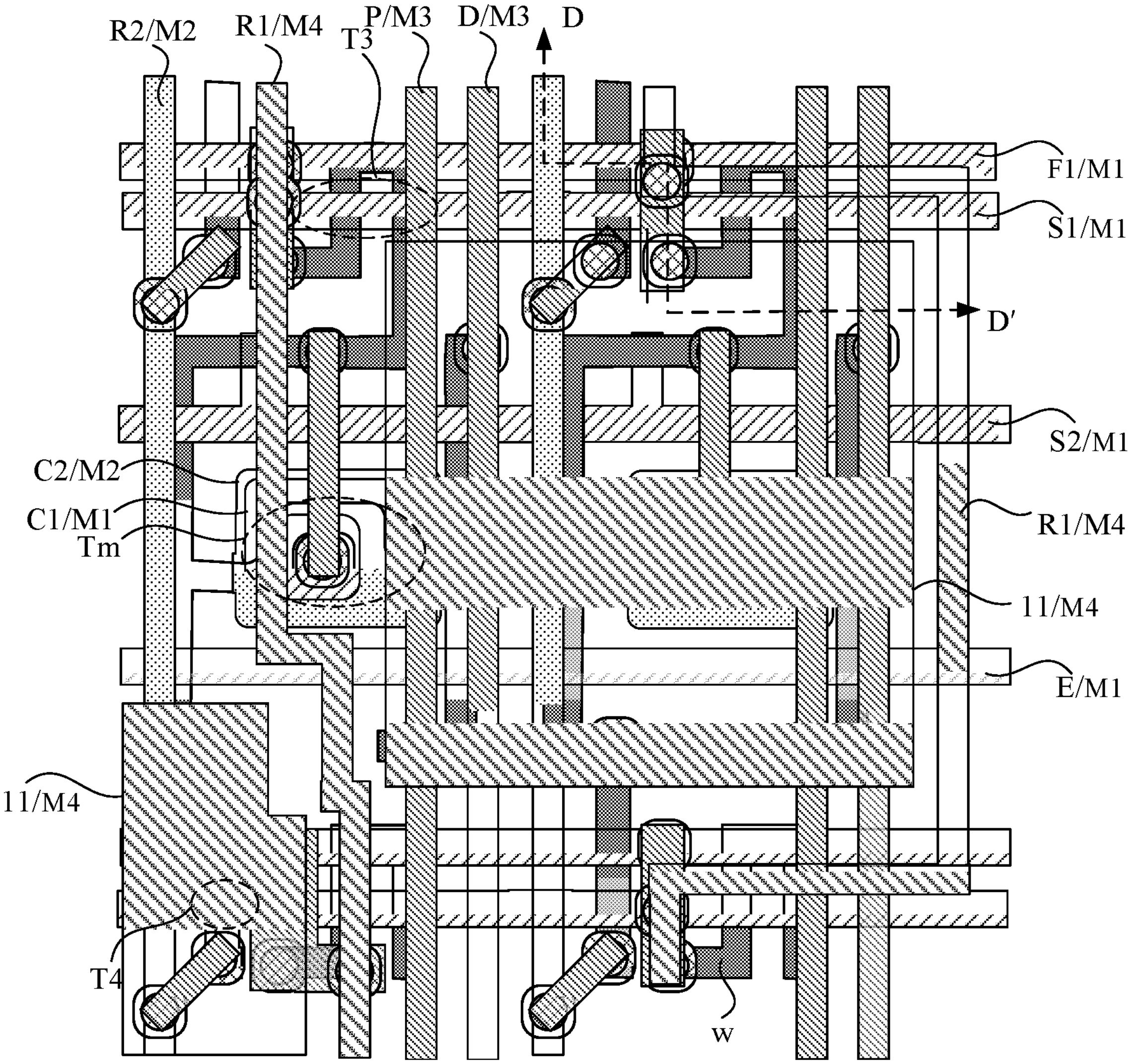
FIG. 19 is a schematic diagram of a display panel according to another embodiment of the present disclosure.

In another embodiment, the extension direction of the first reset signal line R1 and the extension direction of the second reset signal line R2 are the same as the extension direction of the data line D; and the first reset signal line R1 and the second reset signal R2 are located in any two of the second metal layer M2, the third metal layer M3 and the fourth metal layer M4, respectively. FIG. 19 is a schematic diagram of a display panel according to another embodiment of the present disclosure, and FIG. 20 is a schematic cross-sectional view along D-D' shown in FIG. 19.

Figure 20:
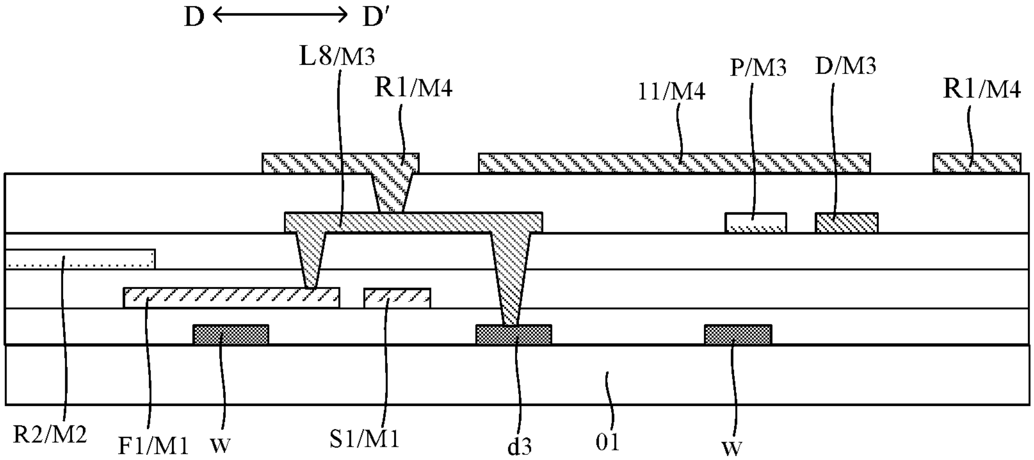
FIG. 20 is a schematic cross-sectional view along D-D' shown in FIG. 19 according to an embodiment of the present disclosure.

In combination with FIG. 19 and FIG. 20, the second reset signal line R2 can be located in the second metal layer M2, and the first reset signal line R1 is located in the fourth metal layer M4. As can be seen from FIG. 19, the first reset signal line R1 can be arranged between adjacent first electrodes 11, and in the local area shown in FIG. 19, the first reset signal line R1 can make a detour around the first electrode 11, theoretically, from a view of the overall display panel, the first reset signal line R1 is in a shape of curved line that bends multiple times. As shown in FIG. 20, first reset signal line R1 is connected to the first terminal d3 of the first reset transistor T3 through an eighth connection line L8. The eighth connection line L8 is located in the third metal layer M3, and the eighth connection line L8 is made in the same process as the data line D. In addition, the display panel further includes a via (via V1 as shown in FIG. 3), through which the pixel circuit is connected to the first electrode 11, and the via, through which the first reset signal line R1 is connected to the eighth connection line L8, can be made in the same process as the via V1.

In addition, FIG. 19 and FIG. 20 further show a first auxiliary signal line F1 located in the first metal layer M1, in other words, the first auxiliary signal line F1 and the first reset signal line R1 are located in different layers. The first auxiliary signal line F1 is electrically connected to the first auxiliary signal line R1 through the eighth connection line L8.

In another embodiment, on the basis of the embodiment corresponding to FIG. 19, the display panel further includes a second auxiliary signal line F2, and for example, the second auxiliary signal line F2 and the first auxiliary signal line F1 can be located in a same layer.

In another embodiment, different from the embodiment corresponding to FIG. 19, the first reset signal line R1 is located in the second metal layer M2, and the second reset signal line R2 is located in the fourth metal layer M4. On this basis, the display panel may further include at least one of a first auxiliary signal line F1 or a second auxiliary signal line F2.

In another embodiment, the extension direction of the first reset signal line R1 and the extension direction of the second reset signal line R2 are the same as the extension direction of the data line D, one of the first reset signal line R1 and the second reset signal line R2 is located in the second metal layer M2, and the other one of the first reset signal line R1 and the second reset signal line R2 is located in the third metal layer M3. In this embodiment, the positions of the first scan line S1, the second scan line S2, the light-emitting line E, the power line P, and the data line D can be the same as shown in FIG. 19. On this basis, if the display panel further includes a first auxiliary signal line located in the first metal layer M1 or the fourth metal layer M4; and if the display panel further includes a second auxiliary signal line located in the first metal layer M1 or the fourth metal layer M4; and if the display panel includes both the first auxiliary signal line and the second auxiliary signal line, the first auxiliary signal line and the second auxiliary signal line can be located in a same layer or in different layers.

In another embodiment, the extension direction of the first reset signal line R1 and the extension direction of the second reset signal line R2 are the same as the extension direction of the data line D, one of the first reset signal line R1 and second reset signal line R2 is located in the third metal layer M3, and the other one of the first reset signal line R1 and second reset signal line R2 is located in the fourth metal layer M4. On this basis, the display panel may further include at least one of a first auxiliary signal line F1 or a second auxiliary signal line F2. The first auxiliary signal line and the second auxiliary signal line are located in a same layer or in different layers. For example, both the first auxiliary signal line and the second auxiliary signal line can be located in the first metal layer M1.

In some embodiments, the extension direction of the first reset signal line R1 is the same as the extension direction of the second reset signal line R2, the first reset signal line R1 and the second reset signal line R2 are located in different layers, and the extension direction of the first reset signal line R1 is the same as the extension direction of the data line D. The display panel further includes a functional metal layer M5 located between second metal layer M2 and the third metal layer M3; the first reset signal line R1, the second reset signal line R2, the power line P, and the data line D are located in at least two of the second metal layer M2, the third metal layer M3, the fourth metal layer M4, or the functional metal layer M5; and at least one of the first reset signal line R1, the second reset signal line R2, the power line P, or the data line D is located in the functional layer metal M5.

Figure 21:
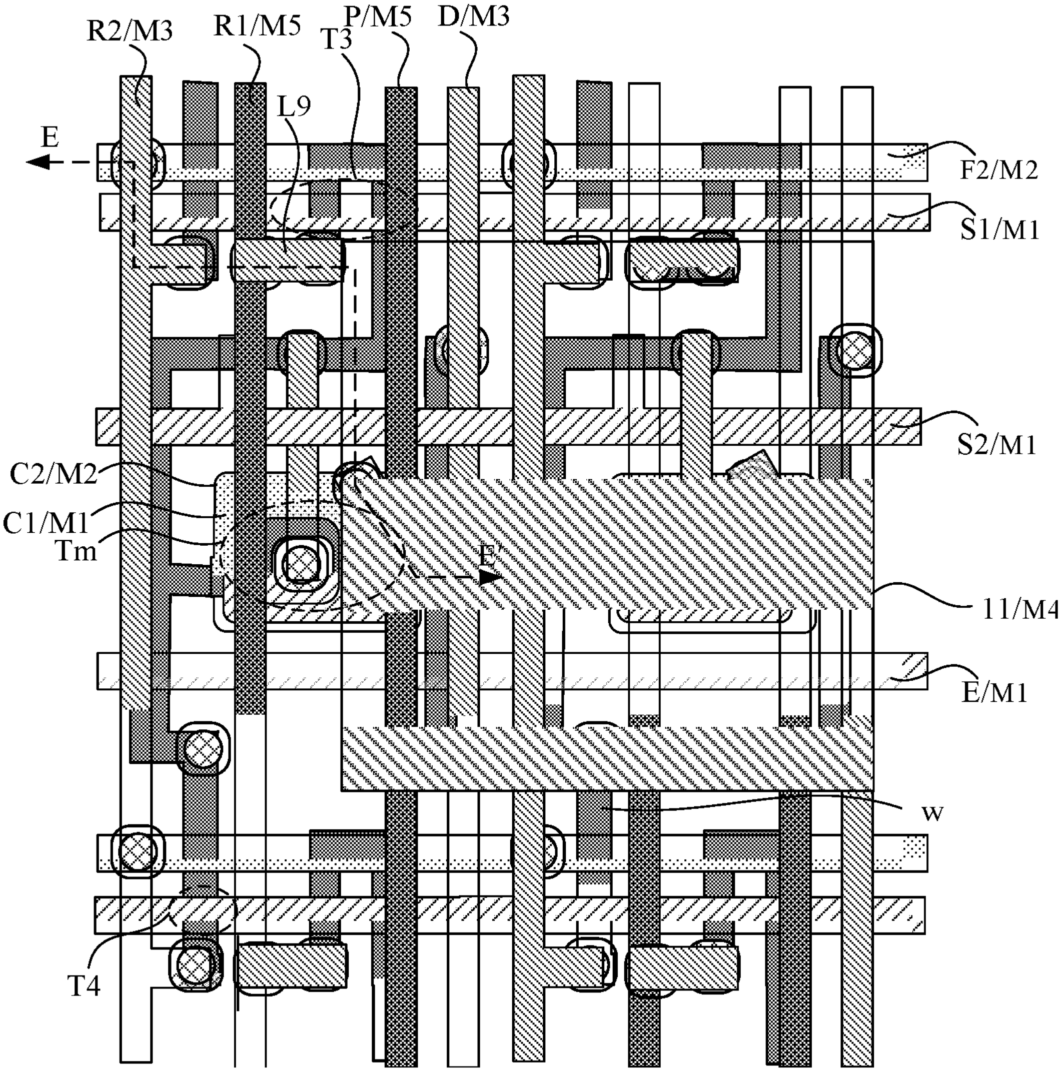
FIG. 21 is a schematic diagram of a display panel according to another embodiment of the present disclosure.
Figure 22:
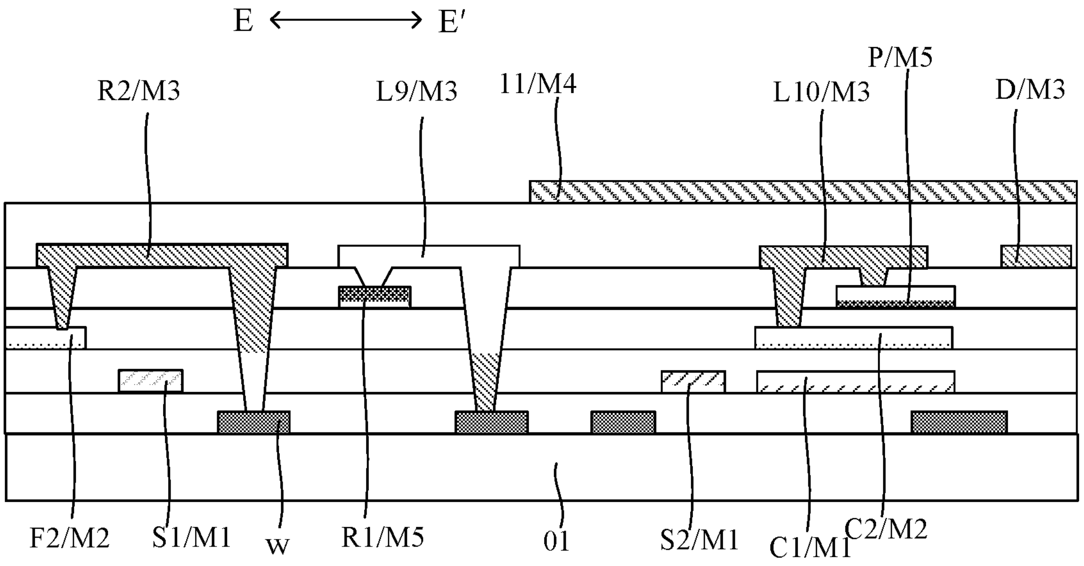
FIG. 22 is a schematic cross-sectional view along E-E' shown in FIG. 21 according to an embodiment of the present disclosure.

FIG. 21 is a schematic diagram of a display panel according to another embodiment of the present disclosure, and FIG. 22 is a schematic cross-sectional view along E-E' shown in FIG. 21. In an embodiment, as shown in FIG. 21 and FIG. 22, the first reset signal line R1 and the power line P are located in the functional metal layer M5; and the second reset signal line R2 and the data line D are located in the third metal layer M3. The first reset signal line R1 is electrically connected to the first terminal of the first reset transistor T3 through a ninth connection line L9, and the power line P is electrically connected to the second electrode plate C2 of the storage capacitor through a tenth connection line L10. FIG. 21 further shows a second auxiliary signal line F2 located in the second metal layer M2, and in another example, the second auxiliary signal line F2 can also be located in the first metal layer M1 or the fourth metal layer M4. In this embodiment, the four signal lines that extend in a same direction are arranged in two metal layers, avoiding an excess of lines in a single metal layer to make a pixel circuit occupy a large area. As a result, a light transmission area of display panel can be increased, thereby increasing an overall light transmission rate. In the case of under-screen optical module solutions, the optical performance of the optical module can be improved.

In another embodiment, the first reset signal line R1 and the power line P are located in the functional metal layer M5, and the second reset signal line R2 and the data line D are located in the third metal layer M3. The display panel further includes a first auxiliary signal line F1. In an example, the first auxiliary signal line F1 can be located in any one layer of the first metal layer M1, the second metal layer M2, and the fourth metal layer M4.

In another embodiment, the extension direction of the first reset signal line R1 and the extension direction of the second reset signal line R2 are the same as the extension direction of the data line D, one of the first reset signal line R1 and the second reset signal line R2 is located in the functional metal layer M5, and the auxiliary signal line corresponding to the reset signal line is also located in the functional metal layer M5. That is, both the first reset signal line R1 and the first auxiliary signal line F1 are located in the functional metal layer M5; or both the second reset signal line R2 and the second auxiliary signal line F2 are located in the functional metal layer M5. In this case, the data line D and the power line P are located in the third metal layer M3.

In another embodiment, the extension direction of the first reset signal line R1 and the extension direction of the second reset signal line R2 are the same as the extension direction of the data line D; the power line P is located in the fifth metal layer M5; the first line D is located in the third metal layer M3; and the first reset signal line R1 and the second reset signal line R2 are located in any two of the second metal layer M2, the third metal layer M3, and the fourth metal layer M4, respectively. If the display includes a first auxiliary signal line in an embodiment, the first auxiliary signal line and the first reset signal line are located in different layers. If the display panel includes a second auxiliary signal line in an embodiment, the second auxiliary signal line and the second reset signal line are located in different layers. If the display panel includes both a first auxiliary signal line and a second auxiliary signal line in an embodiment, the first auxiliary signal line and the second auxiliary signal line can be located in a same layer.

In another embodiment, the extension direction of the first reset signal line R1 and the extension direction of the second reset signal line R2 are the same as the extension direction of the data line D; the data line D is located in the fifth metal layer M5; the power line P is located in the third metal layer M3; and the first reset signal line R1 and the second reset signal line R2 are located in any two of the second metal layer M2, the third metal layer M3, and the fourth metal layer M4, respectively.

In another embodiment, the extension direction of the first reset signal line R1 and the extension direction of the second reset signal line R2 are the same as the extension direction of the data lined; the first reset signal line R1 is located in the fourth metal layer M4; and at least one of the second reset signal line R2, the data line D, or the power line P is located in the functional metal layer.

In another embodiment, the extension direction of the first reset signal line R1 and the extension direction of the second reset signal line R2 are the same as the extension direction of the data line D; the second reset signal line R2 is located in the fourth metal layer M4; and at least one of the first reset signal line R1, the data Line D, or the power line P is located in the functional metal layer.

Figure 23:
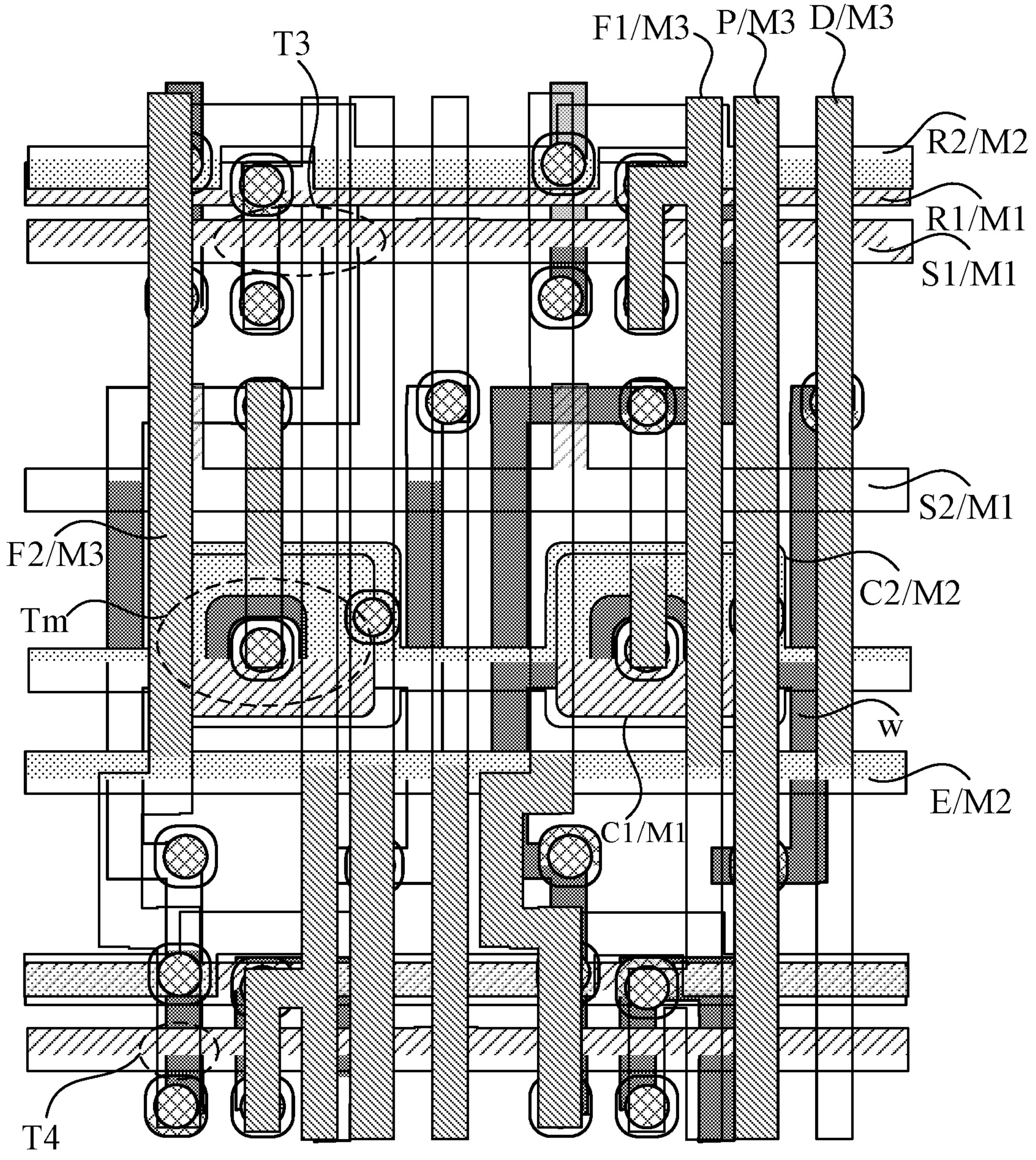
FIG. 23 is a schematic diagram of a display panel according to another embodiment of the present disclosure.

In some embodiments, the first reset signal line R1 at least partially overlaps with the second reset signal line R2 in a direction perpendicular to a plane of the substrate 01. Taking the improvement on the basis of the embodiment corresponding to FIG. 17 as an example, FIG. 23 is a schematic diagram of a display panel according to another embodiment of the present disclosure, as shown in FIG. 23, the extension direction of the first reset signal line R1 is the same as the extension direction of the second reset signal line R2, the first reset signal line R1 is located in the first metal layer M1, the second reset signal line R2 is located in the second metal layer M2, the first reset signal line R1 at least partially overlaps with the second reset signal line R2. The two reset signal lines at least partially overlap with each other, so that the space for wiring of the display panel can be saved, and a non-transmission area of the display panel can be reduced, thereby increasing the light transmission rate of the display panel. Moreover, the two reset signal lines at least partially overlap with each other, so that an area occupied by a single pixel circuit can be reduced. As a result, more pixel circuits can be arranged under a certain size of the display panel, which increases the resolution of the display panel. In addition, a narrow bezel of the display panel can be achieved to improve the user experience while keeping the number of related structures unchanged.

In the embodiment corresponding to FIG. 23, the extension direction of the first reset signal line R1 and the extension direction of the second reset signal line R2 intersect with the extension direction of the data line D, and in the above-mentioned embodiments (embodiment corresponding to FIG. 19 or FIG. 21) in which the extension direction of the first reset signal line R1 and the extension direction of the second reset signal line R2 are the same as the extension direction of the data line D, the first reset signal line R1 and the second reset signal line R2 that are located in different metal layers can also at least partially overlap with each other, thereby saving the space for wiring of the display panel.

In any of the above-mentioned embodiments in which the extension direction of the first reset signal line R1 is the same as the extension direction of the second reset signal line R2 and the two reset signal lines are located in different metal layers, the first reset signal line R1 and the second reset signal R2 can overlap at least partially with each other, similar to the embodiment corresponding to FIG. 23.

In some embodiments, the extension direction of the first reset signal line R1 intersects with the extension direction of the second reset signal line R2. That is, the extension direction of one of the first reset signal line R1 and the second reset signal line R2 is the same as the extension direction of the data line D, and the extension direction of other one of the first reset signal line R1 and the second reset signal line R2 intersects with the extension direction of the data line D. On this basis, an auxiliary signal line that intersects with and is electrically connected to one of the two reset signal lines is provided in the display panel, so that the voltage drop of the transmitted reset signal can be reduced, thereby increasing the brightness uniformity of the display area.

Figure 24:
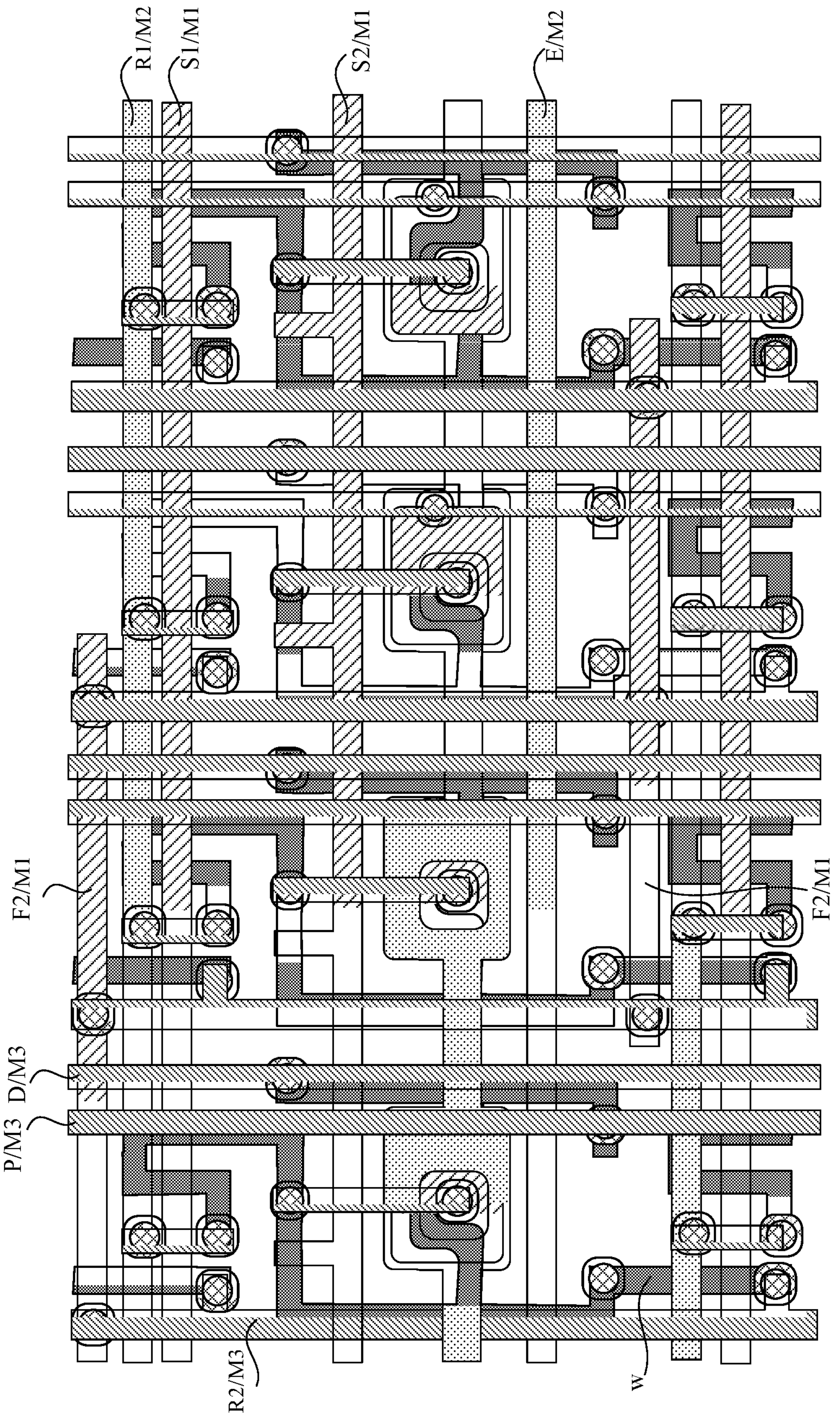
FIG. 24 is a schematic diagram of a display panel according to another embodiment of the present disclosure.

FIG. 24 is a schematic diagram of a display panel according to another embodiment of the present disclosure. In an embodiment, as shown in FIG. 24, the extension direction of the first reset signal line R1 intersects with the extension direction of the data lined, and the extension direction of the second reset signal line R2 is the same as the extension direction of the data line D. The display panel further includes a second auxiliary signal line F2, which is electrically connected to at least two second reset signal lines R2. The extension direction of the second auxiliary signal line F2 is the same as the extension direction of the first reset signal line R1, as shown in FIG. 24, a length of the second auxiliary signal line F2 is smaller than a length of the first reset signal line R1.

Figure 25:
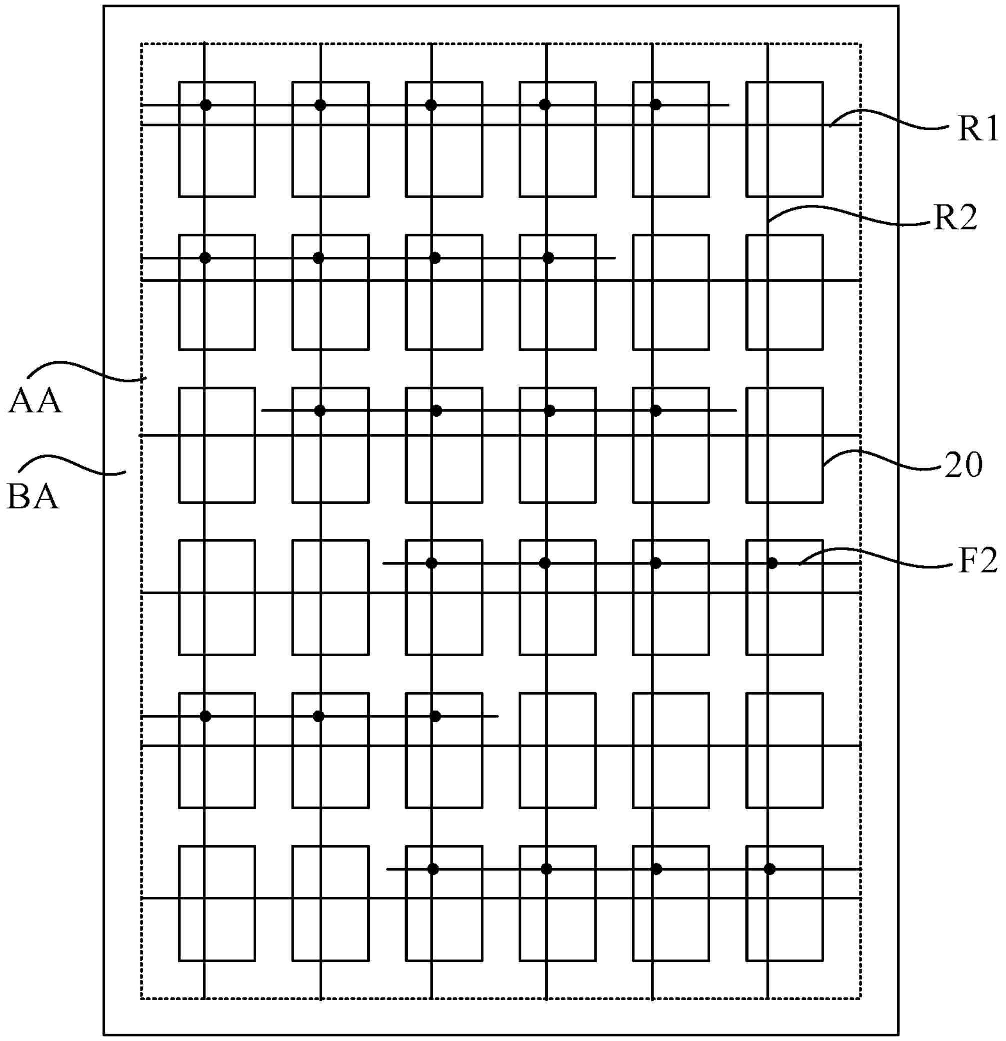
FIG. 25 is a simplified schematic diagram of the display panel shown in FIG. 24 according to an embodiment of the present disclosure.

In this embodiment of the present disclosure, the first reset signal line R1 is electrically connected to all pixel circuits in a pixel circuit row arranged in the extension direction of the first reset signal line R1, and the second reset signal line R2 is electrically connected to all pixel circuits in a pixel circuit row arranged in the extension direction of the second reset signal line R2. FIG. 25 is a simplified schematic diagram of the display panel shown in FIG. 24. In order to clearly indicate an arrangement of the reset signal line and the auxiliary signal line, FIG. 25 simply shows the pixel circuit 20, the first reset signal line R1, the second reset signal line R2, and the second auxiliary signal line F2. As shown in FIG. 25, the second auxiliary signal line F2 is electrically connected to at least two second reset signal lines R2, and a length of the second auxiliary signal line F2 is smaller than a length of the first reset signal line R1. In this embodiment, the second auxiliary signal line F2 is provided, so that the voltage drop of the second reset signal transmitted on the second reset signal line R2 is reduced; besides, the length of the second auxiliary signal line F2 is smaller than the length of the first reset signal line R1, so that the space for wiring of circuit wiring can be saved, thereby increasing the light transmission rate of the display panel to a certain extent, and, in the case of under-screen optical module solutions, the optical performance of the optical module can be improved.

The embodiment corresponding to FIG. 24 shows that the first reset signal line R1 is located in the second metal layer M2, the second reset signal line R2 is located in the third metal layer M3, the second auxiliary signal line F2 is located in the first metal layer M1, and both the data line D and the power line P are located in the third metal layer M3. In some other embodiments, the second auxiliary signal line F2 can be located in the fourth metal layer M4 or the second metal layer M2.

In a case that the display panel includes the first metal layer M1, the second metal layer M2, the third metal layer M3 and the fourth metal layer M4, if the extension direction of the first reset signal line R1 is different from the extension direction of the second reset signal line R2, then the first reset signal line R1 and the second reset signal line R2 are located in two of the first metal layer M1, the second metal layer M2, the third metal layer M3 and the fourth metal layer M4, respectively; but the first reset signal line R1 and the second reset signal line R2 are not located in the first metal layer M1 and the second metal layer M2, respectively. On this basis, if the display panel further includes a first auxiliary signal line and a second auxiliary signal line, the layers where the two auxiliary signal lines are located can be configured according to the layers where the first reset signal line R1 and the second reset signal line R2 are located, if the display panel includes both the first auxiliary signal line and the second auxiliary signal line, the two auxiliary signal lines are located in different layers.

In some embodiments, the display panel includes the first metal layer M1, the second metal layer M2, the third metal layer M3, the fourth metal layer M4, and the functional metal layer M5, and the functional metal layer M5 is located in the third metal layer M3 and the second metal layer M2. For example, one of the first reset signal line R1 and the second reset signal line R2 is located in the functional metal layer M5, and when arranging the corresponding auxiliary signal line, the corresponding auxiliary signal line and the reset signal line connected thereto can be arranged in a same layer, for example, both the second reset signal line R2 and the second auxiliary signal line F2 are located in the functional metal layer M5.

Figure 26:
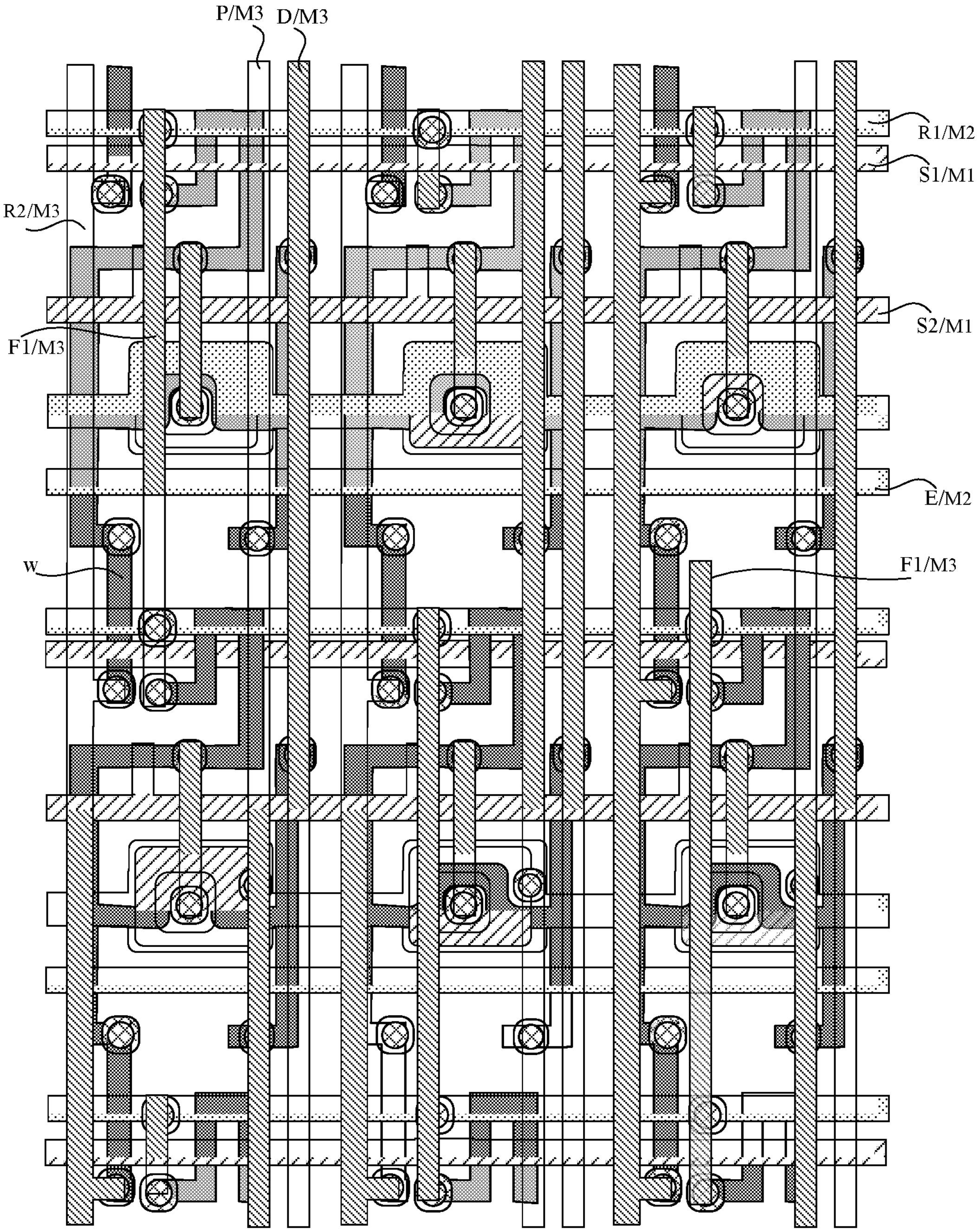
FIG. 26 is a schematic diagram of a display panel according to another embodiment of the present disclosure.

FIG. 26 is a schematic diagram of a display panel according to another embodiment of the present disclosure. In another embodiment, as shown in FIG. 26, the display panel further includes a first auxiliary signal line F1, which is electrically connected to at least two first reset signal lines R1, the extension direction of the first auxiliary signal line F1 is the same as the extension direction of the second reset signal line R2, and a length of the first auxiliary signal line F1 is smaller than a length of second reset signal line R2. As can be seen from FIG. 26, in the local area shown in FIG. 26, the reset signal line R2 substantially runs through the local area, and one end of the first auxiliary signal line F1 ends in the local area. In this embodiment, the first auxiliary signal line F1 is provided, so that the voltage drop of the first reset signal transmitted on the first reset signal line R1 is reduced; besides, the length of the first auxiliary signal line F1 is smaller than the length of the second reset signal line R2, so that the space for wiring of circuit can be saved, thereby increasing the light transmission rate of the display panel to a certain extent. In the display panel, an arrangement of the first auxiliary signal line F1, the first signal reset signal line R1 and the second reset signal line R2 can be understood by reference to the embodiment corresponding to FIG. 25, and this case will not be further illustrated herein with accompanying drawings.

In addition, in an embodiment, as shown in FIG. 26, the first auxiliary signal line F1 is located in the third metal layer M3; and in another embodiment, the first auxiliary signal line F1 can be located in the fourth metal layer M4. In the embodiments in which the display includes a functional metal layer, the first auxiliary signal line F1 can also be located in the functional metal layer.

In addition, in some embodiments, as shown in FIG. 24 and FIG. 26, the extension direction of the first reset signal line R1 intersects with the extension direction of the data line D; and in another embodiment, the extension direction of first reset signal line R1 may be the same as the extension direction of the data line D, and the extension direction of the second reset signal line R2 can intersect with the extension direction of the data line D, in this case, an arrangement of the auxiliary signal line can be understood with reference to the embodiments above, which will not further described herein.

Figure 27:
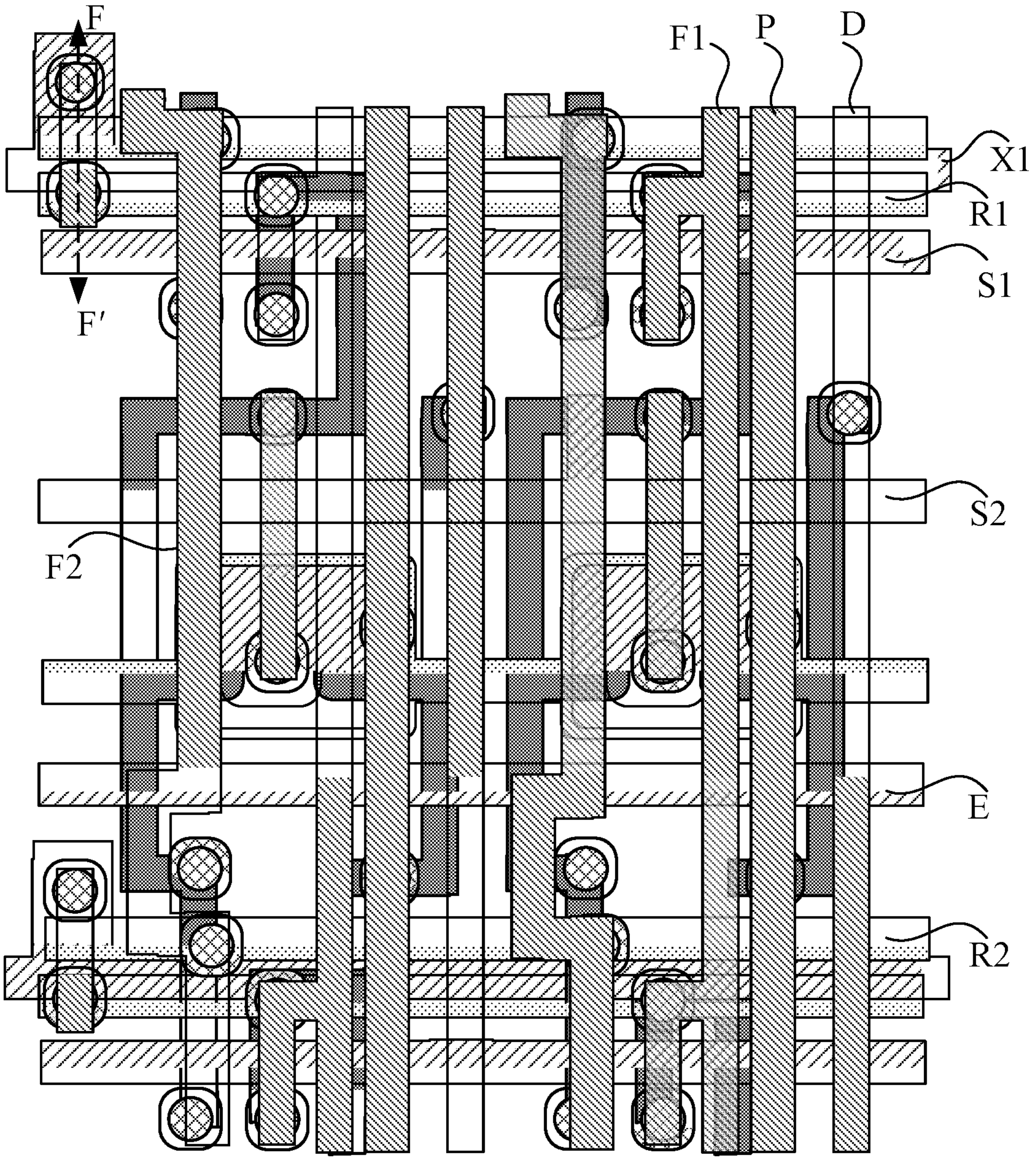
FIG. 27 is a schematic diagram of a display panel according to another embodiment of the present disclosure.
Figure 28:
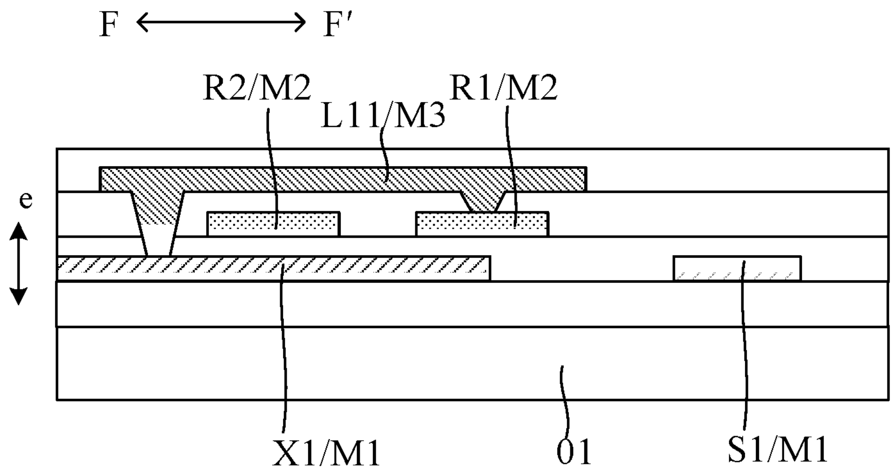
FIG. 28 is a schematic cross-sectional view along F-F' shown in FIG. 27 according to an embodiment of the present disclosure.

In an embodiment, the display panel further includes a first signal sub-line, which is connected in parallel with the first reset signal line to reduce the voltage drop on the first reset signal line R1. FIG. 27 is a schematic diagram of a display panel according to another embodiment of the present disclosure, and FIG. 28 is a schematic cross-sectional view along F-F' shown in FIG. 27. As shown in FIG. 27 and FIG. 28, the first signal sub-line X1 and the first reset signal line R1 are located in different layers, and the first signal sub-line xl overlaps at least partially with the first reset signal line R1 in a direction e perpendicular to the plane of the substrate 01, and the first signal-line-line xl is electrically connected to the first reset signal line R1. In an embodiment, as shown in FIG. 28, the first reset signal line R1 is located in the first metal layer M1, and the first signal sub-line X1 is located in the second metal layer M2; and in another embodiment, the first signal sub-line X1 can be located in the fourth metal layer M4 or the functional metal layer M5. In practice, a layer where the first reset signal line R1 is located can be configured according to the layer where the first reset signal line R1 is located. In this embodiment, the first signal sub-line X1 overlaps at least partially with and is electrically connected to the first reset signal line R1, that is, the signal line for transmitting a first reset signal is a double-layer line, thereby further reducing the voltage drop on the first reset signal line and further reducing power consumption.

In an embodiment, as shown in FIG. 28, the first signal sub-line X1 is electrically connected to the first reset signal line R1 through an eleventh connection line L11 located in the third metal layer M3. In another embodiment, the signal first sub-line X1 can be directly electrically connected to the first reset signal line R1 through a via that penetrates through an insulation layer located between the first signal sub-line X1 and the first reset signal line R1, which will not be illustrated in the accompanying drawings.

Figure 29:
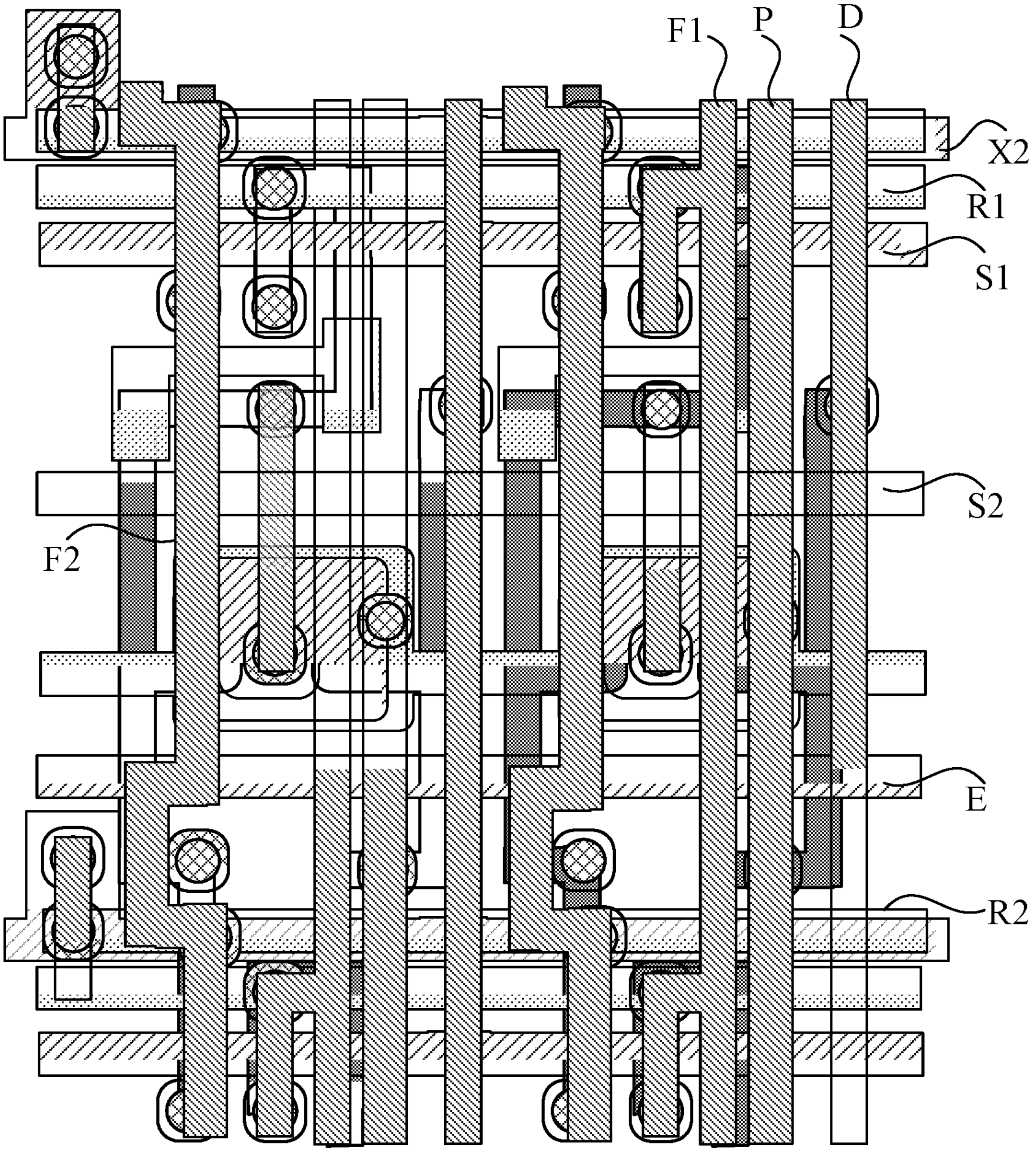
FIG. 29 is a schematic diagram of a display panel according to another embodiment of the present disclosure.

In an embodiment, the display panel further includes a second signal sub-line, which is connected in parallel with the second reset signal line to reduce the voltage drop on the second reset signal line R2. FIG. 29 is a schematic diagram of a display panel according to another embodiment of the present disclosure, as shown in FIG. 29, the display panel further includes a second signal sub-line X2, which overlaps at least partially with and is electrically connected to the second reset signal line R2. That is, the signal line for transmitting a second reset signal is a double-layer line, thereby reducing the voltage drop on the second reset signal line, increasing the brightness uniformity of the display area, and reducing power consumption. The connection between the second signal sub-line X2 and the second reset signal line R2 can be configured with reference to the embodiment corresponding to FIG. 28, which will not be repeated herein.

In an embodiment, the display panel further includes a third signal sub-line. The third signal sub-line and the first auxiliary signal line F1 are located in different layers. The third signal sub-line overlaps at least partially with the first auxiliary signal line F1 in the direction perpendicular to the plane of the substrate 01, and the third signal sub-line is electrically connected to the first auxiliary signal line F1. That is, in this embodiment, the first auxiliary signal line is a double-layer line, thereby reducing the voltage drop of the transmitted first reset signal, and thus increasing the brightness uniformity of the display area, and reducing power consumption. In this embodiment, the connection between the third signal sub-line and the first auxiliary signal line can be configured with reference to the embodiment corresponding to FIG. 28. In practice, a layer where the third sub-signal line is located can be configured according to the layer where the first auxiliary signal line is located.

In an embodiment, the display panel further includes a fourth signal sub-line, and the fourth signal sub-line and the second auxiliary signal line F2 are arranged in different layers. The fourth signal sub-line overlaps at least partially with the second auxiliary signal line F2 in the direction perpendicular to the plane of the substrate 01, and is electrically connected to the second auxiliary signal line F2. That is, in this embodiment, the second auxiliary signal line is a double-layer line, thereby reducing the voltage drop of the transmitted second reset signal, and thus increasing the brightness uniformity of the display area and reducing power consumption. In this embodiment, the connection between the fourth signal sub-line and the second auxiliary signal line can be configured with reference to the embodiment corresponding to FIG. 28. In practice, a layer where the fourth signal sub-line is located can be configured according to the layer where the second auxiliary signal line is located.

In some embodiments of the present disclosure, the display panel includes a semiconductor layer w, a first metal layer M1, a second metal layer M2, a functional metal layer M5, a third metal layer M3, and a fourth metal layer M4 that are sequentially arranged the substrate 01 along a direction away from the substrate 01. The first metal layer M1 and the second metal layer M2 are made of a same material, and the third metal layer M3 and the functional metal layer M5 are made of a same material. The light-emitting device includes a first electrode located in the fourth metal layer M4. Due to a large thickness of a signal line formed in each of the third metal layer M3 and the functional metal layer M5, a planarization layer formed prior to the fourth metal layer M4 cannot be formed into a relatively flat surface, as a result, the first electrode formed using the fourth metal layer M4 has poor planarization, leading to uneven dispersion of light emitted from the light-emitting device, which affects the display effect. With such basis, in the present disclosure, the wiring of the signal line in the metal layer closest to the first electrode is designed to alleviate uneven dispersion of light emitted from the light-emitting device.

Figure 30:
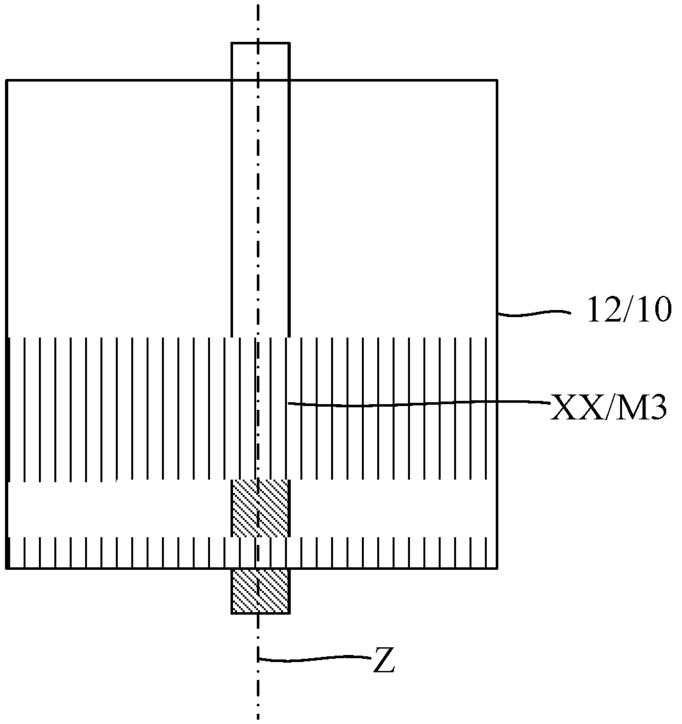
FIG. 30 is a schematic diagram of a display panel according to another embodiment of the present disclosure.

FIG. 30 is a schematic diagram of a display panel according to another embodiment of the present disclosure. FIG. 30 is a top view, which only shows a light-emitting layer 12 of the light-emitting device 10, and a signal line XX located below. The display panel includes a pixel definition layer including an opening, the light-emitting layer 12 is located in the opening, and a shape of the light-emitting layer 12 is substantially the same as a shape of the opening. In a process of forming the display panel, the planarization layer is formed after the pixel circuit is formed; then the patterned first electrode 11 is formed; then the pixel definition layer is formed and the opening that exposes the first electrode 11 is formed; then an organic functional layer is formed using an evaporation process, and the organic functional layer includes a common layer, such as an electron injection layer, an electron transmission layer, a hole transmission layer, and a hole injection layer; and a light-emitting material layer, which is evaporated in the opening of the pixel definition layer and extends to a side wall of the opening or more positions, the light-emitting material layer formed in the opening being defined as a light-emitting device 12 in an embodiment of the present disclosure) and then a second electrode of the light-emitting device is formed, and in an example, the second electrodes of all the light-emitting devices are connected to each other to form an entire layer. The direction of top view is the same as a direction of an orthographic projection of the plane of the substrate, thus, in the top view, the light-emitting layer 12 coincides with an orthographic projection of the light-emitting layer 12 on the plane of the substrate, and the signal line XX located in the third metal layer M3 coincides with an orthographic projection of the signal line XX on the plane of the substrate.

As shown in FIG. 30, the orthographic projection of the light-emitting layer 12 in the plane of the substrate 01 has a centerline Z. That is, a graphic shape of the light-emitting layer 12 is symmetrical about the centerline Z, or in other words, a graphic shape of the opening formed in the pixel definition layer is symmetrical about the centerline Z. An orthographic projection of the signal line XX located in the third metal layer M3 on the plane of the substrate overlaps at least partially with the centerline Z. In this way, light emitted from the light-emitting device spreads as evenly as possible to two sides of the centerline Z, thereby alleviating uneven dispersion of light emitted from the light-emitting device, and thus improving the display effect.

Figure 31:
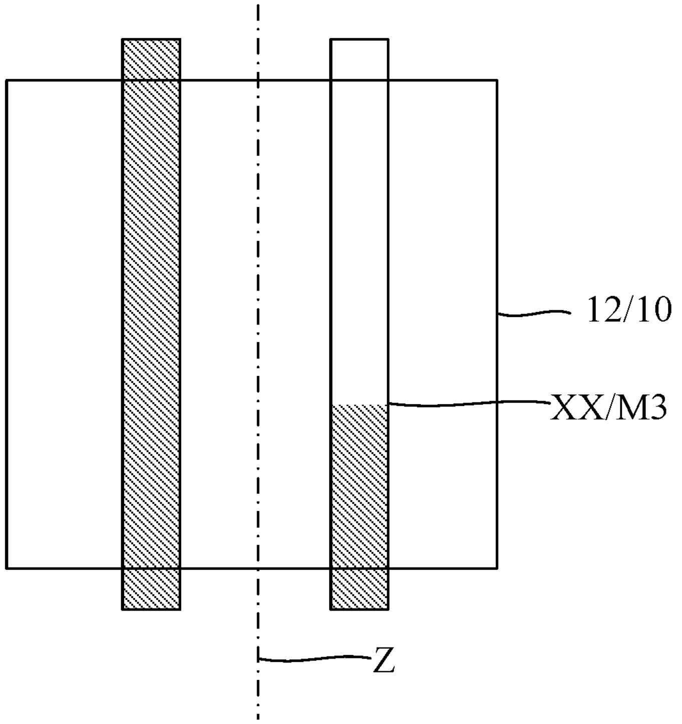
FIG. 31 is a schematic diagram of a display panel according to another embodiment of the present disclosure.

FIG. 31 is a schematic diagram of a display panel according to another embodiment of the present disclosure. In another embodiment, as shown in FIG. 31, at least two signal lines XX located in the third metal layer M3 are symmetrical about the centerline Z. In this way, light emitted from the light-emitting device spreads as evenly as possible to two sides of the centerline Z, thereby alleviating uneven dispersion of light emitted from the light-emitting device, and thus improving the display effect. In an embodiment, as shown in FIG. 31, two signal lines XX located in the third metal layer M3 overlap with the light-emitting layer 12. In another embodiment, four signal lines XX located in the third metal layer M3 overlap with the light-emitting layer 12. In this case, when viewing from the top view, two of the four signal lines XX are located at a left side of the centerline Z, and the other two of the four signal lines XX are located at a right side of the centerline Z.

In some embodiments, the signal lines XX located in the third metal layer M3 include a data line D and a power line P; in some embodiments, the signal lines XX located in the third metal layer M3 further include a first reset signal line R1 and/or a seconded reset signal line R2; and in some embodiments, the signal lines XX located in the third metal layer M3 further include a first auxiliary signal line F1 and/or a second auxiliary signal line F2. The signal lines XX in the above embodiments can be designed as shown in FIG. 30 or FIG. 31.

Figure 32:
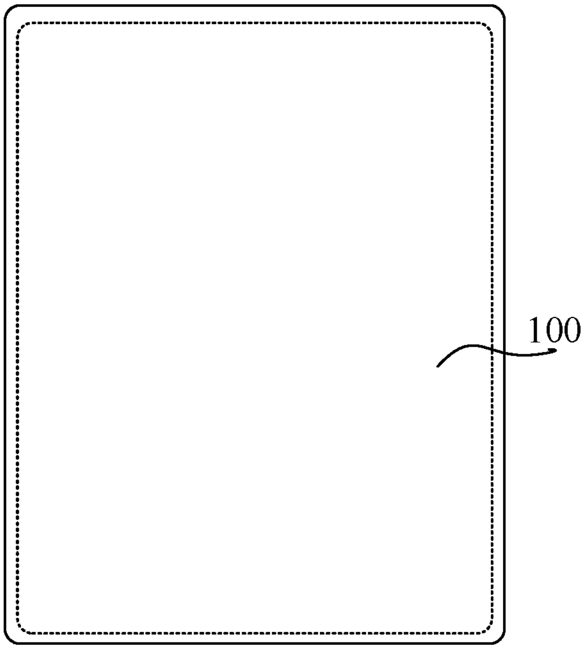
FIG. 32 is a schematic diagram of a display device according to an embodiment of the present disclosure.

An embodiment of the present disclosure further provides a display device. FIG. 32 is a schematic diagram of a display device according to an embodiment of the present disclosure, as shown in FIG. 32, the display device includes the display panel 100 described in any embodiment of the present disclosure. In this embodiment of the present disclosure, the display device may be any device with a display function, such as a mobile phone, a flat-screen computer, a laptop computer, an e-book, a television, a smart wearable product, etc.

The above-described embodiments are merely some embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising: pixel circuits, light-emitting devices, first reset signal lines, second reset signal lines, auxiliary signal lines, a first signal sub-line located in a different layer from the first reset signal lines and electrically connected to one of the first reset signal lines, and a substrate, wherein one of the pixel circuits comprises a driving transistor, a first reset transistor, and a second reset transistor, wherein the first reset transistor comprises a first electrode electrically connected to one of the first reset signal lines, and a second electrode coupled to a control terminal of the driving transistor; and wherein the second reset transistor comprises a first electrode electrically connected to one of the second reset signal lines, and a second electrode electrically connected to a first electrode of one of the light-emitting devices;

wherein one of the auxiliary signal lines intersects with and is connected to one of the first reset signal lines or one of the second reset signal lines; and wherein the first signal sub-line at least partially overlaps with one of the first reset signal lines in a direction perpendicular to a plane of the substrate, and an extension direction of the first signal sub-line is the same as an extension direction of one of the first reset signal lines.

2. The display panel according to claim 1, wherein the auxiliary signal lines comprise a first auxiliary signal line, wherein an extension direction of the first auxiliary signal line intersects with an extension direction of one of the first reset signal lines, and wherein the first auxiliary signal line is electrically connected to at least two of the first reset signal lines.

3. The display panel according to claim 1, wherein the auxiliary signal lines comprise a second auxiliary signal line, wherein an extension direction of the second auxiliary signal line intersects with an extension direction of one of the second reset signal lines, and wherein the second auxiliary signal line is electrically connected to at least two of the second reset signal lines.

4. The display panel according to claim 1, wherein an extension direction of one of the first reset signal lines is the same as an extension direction of one of the second reset signal lines.

5. The display panel according to claim 4, wherein the first reset signal lines and the second reset signal lines are located in a same layer.

6. The display panel according to claim 5, further comprising:

a substrate; and a semiconductor layer, a first metal layer, a second metal layer, a third metal layer, and a fourth metal layer that are sequentially arranged on the substrate along a direction away from the substrate, wherein one of the driving transistors comprises a channel formed in the semiconductor layer;

wherein one of the pixel circuits further comprises a storage capacitor, and wherein the storage capacitor comprises a first electrode plate located in the first metal layer and a second electrode plate located in the second metal layer;

wherein the first electrode of one of the light-emitting devices is located in the fourth metal layer; and wherein the first reset signal lines are located in one of the first metal layer, the second metal layer, the third metal layer, and the fourth metal layer.

7. The display panel according to claim 4, wherein the first reset signal lines are located in a different layer from the second reset signal lines.

8. The display panel according to claim 7, further comprising:

a substrate;

a semiconductor layer, a first metal layer, a second metal layer, a third metal layer and a fourth metal layer that are sequentially arranged on the substrate along a direction away from the substrate; and a power line and a data line that are located in the third metal layer, wherein an extension direction of the power line is the same as an extension direction of the data line, wherein one of the driving transistors comprises a channel formed in the semiconductor layer;

wherein one of the pixel circuits further comprises a storage capacitor, and wherein the storage capacitor comprises a first electrode plate located in the first metal layer and a second electrode plate located in the second metal layer;

wherein the first electrode of one of the light-emitting devices is located in the fourth metal layer; and wherein the extension direction of one of the first reset signal lines intersects with the extension direction of the data line, and wherein one of the first reset signal lines and one of the second reset signal lines are located in two of the first metal layer, the second metal layer, and the fourth metal layer, respectively.

9. The display panel according to claim 7, further comprising:

a substrate;

a semiconductor layer, a first metal layer, a second metal layer, a functional metal layer, a third metal layer and a fourth metal layer that are sequentially arranged on the substrate along a direction away from the substrate;

a power line; and a data line, wherein an extension direction of the power line is the same as an extension direction of the data line, wherein one of the driving transistors comprises a channel formed in the semiconductor layer;

wherein one of the pixel circuits further comprises a storage capacitor, and wherein the storage capacitor comprises a first electrode plate located in the first metal layer and a second electrode plate located in the second metal layer;

wherein the first electrode of one of the light-emitting devices is located in the fourth metal layer; and wherein the extension direction of one of the first reset signal lines intersects with the extension direction of the data line; and wherein the power line, the data line, one of the first reset signal lines, and one of the second reset signal lines are located in at least two of the first metal layer, the second metal layer, the fourth metal layer, or the functional metal layer, respectively; and wherein at least one of the power line, the data line, one of the first reset signal lines, or one of the second reset signal lines is located in the functional metal layer.

10. The display panel according to claim 7, further comprising:

a substrate; and a semiconductor layer, a first metal layer, a second metal layer, a functional metal layer, a third metal layer and a fourth metal layer that are sequentially arranged on the substrate along a direction away from the substrate;

a power line; and a data line, wherein an extension direction of the power line is the same as an extension direction of the data line, wherein one of the driving transistors comprises a channel formed in the semiconductor layer;

wherein one of the pixel circuits further comprises a storage capacitor, and wherein the storage capacitor comprises a first electrode plate located in the first metal layer and a second electrode plate located in the second metal layer;

wherein the first electrode of one of the light-emitting devices is located in the fourth metal layer;

wherein the extension direction of one of the first reset signal lines is the same as the extension direction of the data line; and wherein the power line, the data line, one of the first reset signal lines, and one of the second reset signal lines are located in at least two of the second metal layer, the third metal layer, the fourth metal layer, or the functional metal layer, respectively; and wherein at least one of the power line, the data line, one of the first reset signal lines, or one of the second reset signal lines is located in the functional metal layer.

11. A display device, comprising a display panel, wherein the display panel comprises pixel circuits, light-emitting devices, first reset signal lines, second reset signal lines, auxiliary signal lines, a first signal sub-line located in a different layer from the first reset signal lines and electrically connected to one of the first reset signal lines, and a substrate, wherein one of the pixel circuits comprises a driving transistor, a first reset transistor, and a second reset transistor, wherein the first reset transistor comprises a first electrode electrically connected to one of the first reset signal lines, and a second electrode coupled to a control terminal of the driving transistor; and wherein the second reset transistor comprises a first electrode electrically connected to one of the second reset signal lines, and a second electrode electrically connected to a first electrode of one of the light-emitting devices;

wherein one of the auxiliary signal lines intersects with and is connected to one of the first reset signal lines or one of the second reset signal lines; and wherein the first signal sub-line at least partially overlaps with one of the first reset signal lines in a direction perpendicular to a plane of the substrate, and an extension direction of the first signal sub-line is the same as an extension direction of one of the first reset signal lines.

* * * * *